US012628674B2

(12) United States Patent
Ahn et al.

(10) Patent No.: US 12,628,674 B2
(45) Date of Patent: May 12, 2026

(54) SEMICONDUCTOR PACKAGE

(71) Applicant: SAMSUNG ELECTRONICS CO., LTD., Suwon-si (KR)

(72) Inventors: Seok Geun Ahn, Suwon-si (KR); Hwanyoung Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 410 days.

(21) Appl. No.: 18/117,736

(22) Filed: Mar. 6, 2023

(65) Prior Publication Data

US 2024/0014117 A1      Jan. 11, 2024

(30) Foreign Application Priority Data

Jul. 8, 2022      (KR) ........................ 10-2022-0084484

(51) Int. Cl.
   *H01L 23/498*       (2006.01)
   *H01L 23/00*       (2006.01)
               (Continued)
(52) U.S. Cl.
   CPC .. *H01L 23/49838* (2013.01); *H01L 23/49816* (2013.01); *H01L 23/49822* (2013.01);
               (Continued)
(58) Field of Classification Search
   CPC ......... H01L 23/49838; H01L 23/49816; H01L 23/49822; H01L 23/49833; H01L 23/49894; H01L 24/13; H01L 24/16; H01L 24/32; H01L 24/73; H01L 25/162;

H01L 25/165; H01L 2224/13147; H01L 2224/16235; H01L 2224/32225; H01L 2224/73253; H01L 2924/1431; H01L 2924/1434; H10B 80/00
   See application file for complete search history.

(56) References Cited

U.S. PATENT DOCUMENTS 8,937,381 B1 *   1/2015   Dunlap ............. H01L 23/49811
                                                                257/784
9,385,095 B2    7/2016   Jeng et al.
                     (Continued)

FOREIGN PATENT DOCUMENTS

KR       10-2020-0134377 A      12/2020

*Primary Examiner* — Benjamin Tzu-Hung Liu
(74) *Attorney, Agent, or Firm* — Sughrue Mion, PLLC

(57)                    ABSTRACT

A semiconductor package includes a first lower redistribution layer, a first upper redistribution layer over the first lower redistribution layer, a first semiconductor chip between the first lower redistribution layer and the first upper redistribution layer, a first connection post spaced apart from the first semiconductor chip and connecting the first lower redistribution layer to the first upper redistribution layer, a first interposition layer on the first upper redistribution layer, a second interposition layer on the first interposition layer, a second lower redistribution layer on the second interposition layer, a second upper redistribution layer over the second lower redistribution layer, a second semiconductor chip between the second lower redistribution layer and the second upper redistribution layer, and a second connection post spaced apart from each other and connecting the second lower redistribution layer to the second upper redistribution layer.

15 Claims, 22 Drawing Sheets

(51) Int. Cl.
    *H01L 25/16*         (2023.01)
    *H10B 80/00*       (2023.01)

(52) U.S. Cl.
    CPC .. *H01L 23/49833* (2013.01); *H01L 23/49894*
        (2013.01); *H01L 24/13* (2013.01); *H01L 24/16*
        (2013.01); *H01L 24/32* (2013.01); *H01L 24/73*
        (2013.01); *H01L 25/162* (2013.01); *H01L*
        *25/165* (2013.01); *H10B 80/00* (2023.02);
        *H01L 2224/13147* (2013.01); *H01L*
        *2224/16235* (2013.01); *H01L 2224/32225*
        (2013.01); *H01L 2224/73253* (2013.01); *H01L*
        *2924/1431* (2013.01); *H01L 2924/1434*
        (2013.01)

(56) References Cited

U.S. PATENT DOCUMENTS

| | | | |
|---|---|---|---|
| 9,780,072 | B2 | 10/2017 | Jeng et al. |
| 10,032,756 | B2 | 7/2018 | Lin et al. |
| 10,373,885 | B2 | 8/2019 | Yu et al. |
| 11,004,826 | B2 | 5/2021 | Yu et al. |
| 11,201,127 | B2 | 12/2021 | Kim et al. |
| 11,239,194 | B2 | 2/2022 | Jeng et al. |
| 11,264,333 | B2 | 3/2022 | Chen et al. |
| 2010/0140779 | A1 | 6/2010 | Lin et al. |
| 2011/0031607 | A1* | 2/2011 | Lin .......................... H01L 25/03 |
| | | | 257/E23.116 |
| 2014/0124777 | A1* | 5/2014 | Nakatani ........... H01L 23/49827 |
| | | | 257/737 |
| 2021/0391314 | A1 | 12/2021 | Jeng et al. |
| 2022/0013494 | A1* | 1/2022 | Huang .................... H01L 25/50 |

* cited by examiner

SEMICONDUCTOR PACKAGE

CROSS-REFERENCE TO RELATED APPLICATION

This U.S. nonprovisional application claims priority under 35 U.S.C § 119 to Korean Patent Application No. 10-2022-0084484 filed on Jul. 8, 2022 in the Korean Intellectual Property Office, the disclosure of which is hereby incorporated by reference in its entirety.

BACKGROUND

The present disclosure relates to a semiconductor package, and more particularly, to a semiconductor package including a connection post and an interposition layer.

In response to the rapid development of the electronic industry and user demands, electronic products have become smaller and increasingly multifunctional. There are also increased needs for miniaturization and multi-functionality of semiconductor devices used for electronic products.

Recently, packages have been developed in which semiconductor chips are stacked to increase storage capacity and data process speeds. Such packages are required to densely stack the semiconductor chips.

SUMMARY

It is an aspect to provide a semiconductor package with increased reliability and improved electrical properties.

According to an aspect of some embodiments, a semiconductor package may comprise: a first lower redistribution layer; a first upper redistribution layer over the first lower redistribution layer; a first semiconductor chip between the first lower redistribution layer and the first upper redistribution layer; a first connection post spaced apart from the first semiconductor chip and connecting the first lower redistribution layer to the first upper redistribution layer; a first interposition layer on the first upper redistribution layer; a second interposition layer on the first interposition layer; a second lower redistribution layer on the second interposition layer; a second upper redistribution layer over the second lower redistribution layer; a second semiconductor chip between the second lower redistribution layer and the second upper redistribution layer; and a second connection post spaced apart from each other and connecting the second lower redistribution layer to the second upper redistribution layer.

According to another aspect of some embodiments, a semiconductor package may comprise: a first lower redistribution layer; a first upper redistribution layer on the first lower redistribution layer; a first semiconductor chip between the first lower redistribution layer and the first upper redistribution layer; a first interposition layer on the first upper redistribution layer; a second interposition layer on the first interposition layer; a second lower redistribution layer on the second interposition layer; a second upper redistribution layer on the second lower redistribution layer; and a second semiconductor chip between the second lower redistribution layer and the second upper redistribution layer. Each of the first lower redistribution layer, the first upper redistribution layer, the second lower redistribution layer, and the second upper redistribution layer may include a redistribution pattern and a redistribution dielectric layer that surrounds the redistribution pattern. The redistribution dielectric layer may include a photosensitive dielectric material.

According to yet another aspect of some embodiments, a semiconductor package may comprise: a solder ball; a first lower redistribution layer on the solder ball; a first die attach film on the first lower redistribution layer; a first semiconductor chip on the first die attach film; a first molding layer on the first semiconductor chip; a first upper redistribution layer on the first molding layer; a first connection post that connects the first lower redistribution layer to the first upper redistribution layer; a first chip post that connects the first semiconductor chip to the first upper redistribution layer; a first interposition layer on the first upper redistribution layer; a second interposition layer on the first interposition layer; a second lower redistribution layer on the second interposition layer; a second molding layer on the second lower redistribution layer; a second semiconductor chip on the second molding layer; a second die attach film on the second semiconductor chip; a second upper redistribution layer on the second die attach film; a second connection post that connects the second lower redistribution layer to the second upper redistribution layer; and a second chip post that connects the second semiconductor chip to the second lower redistribution layer. The first connection post may vertically overlap the second semiconductor chip. The second connection post may vertically overlap the first semiconductor chip.

BRIEF DESCRIPTION OF THE DRAWINGS

FIG. 1A illustrates a cross-sectional view showing a semiconductor package according to some embodiments.

FIG. 7 illustrates a cross-sectional view showing a semiconductor package according to some embodiments.

FIG. 11 illustrates a cross-sectional view showing a semiconductor package according to some embodiments.

DETAILED DESCRIPTION

The following will describe in detail a semiconductor package according to the present inventive concepts with reference to the accompanying drawings.

Figure 1A:
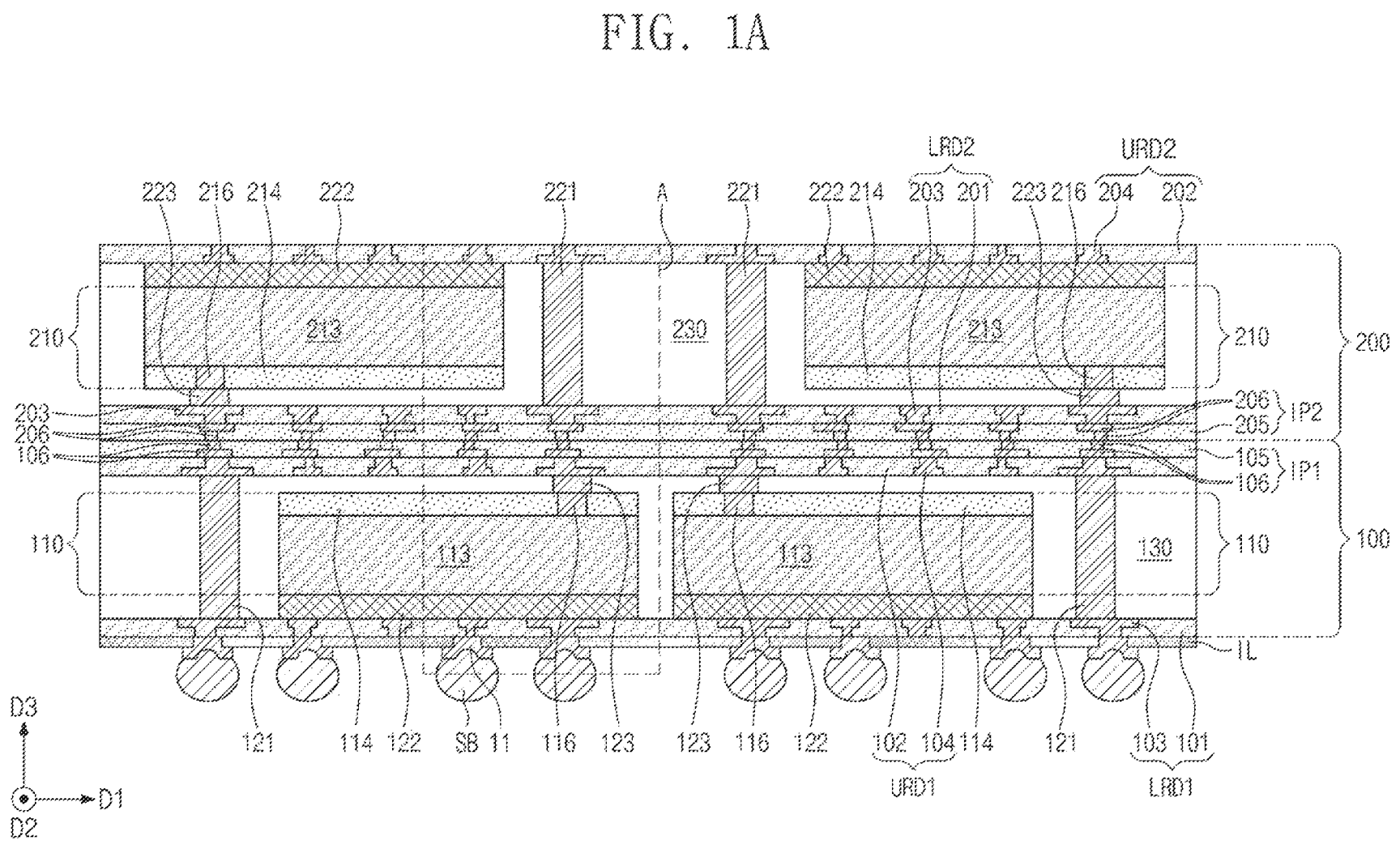
Figure 1B:
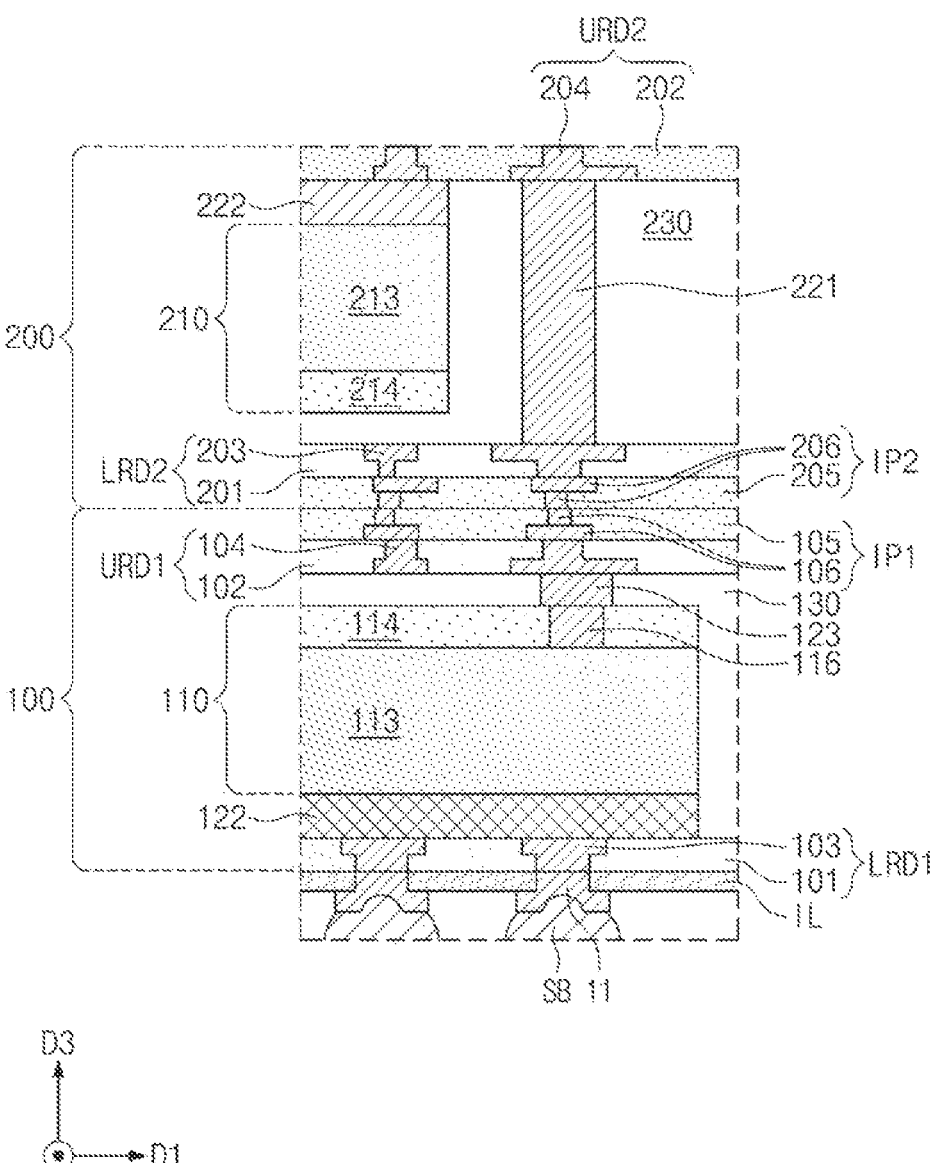
FIG. 1B illustrates an enlarged view showing section A of FIG. 1A.
Figure 1C:
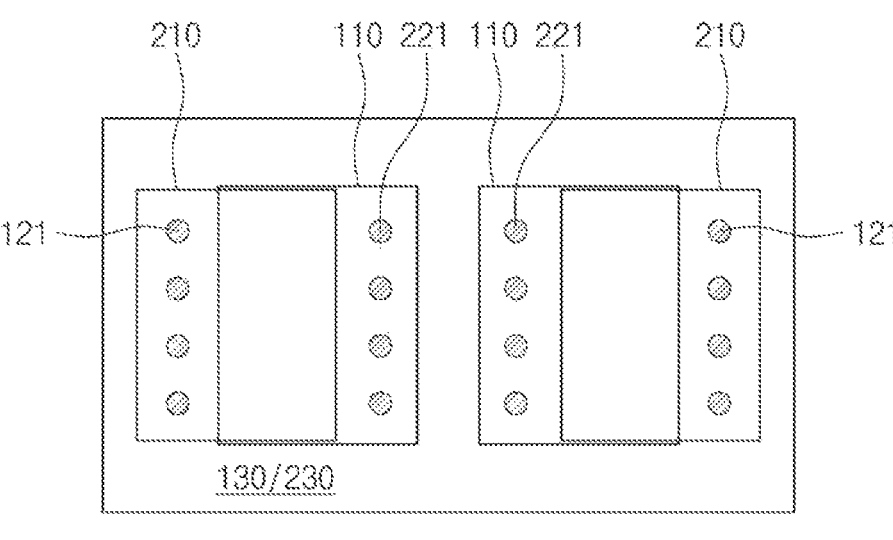
FIG. 1C illustrates a top view showing the semiconductor package depicted in FIG. 1A.
Figure 1C:
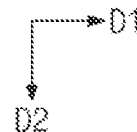

FIG. 1A illustrates a cross-sectional view showing a semiconductor package according to some embodiments. FIG. 1B illustrates an enlarged view showing section A of FIG. 1A. FIG. 1C illustrates a top view showing the semiconductor package depicted in FIG. 1A.

Referring to FIGS. 1A, 1B, and 1C, a semiconductor package may include a solder dielectric layer IL, solder balls SB, an under-bump metal (UBM) 11 on the solder ball SB, a first semiconductor structure 100 on the under-bump metal 11, and a second semiconductor structure 200 on the first semiconductor structure 100. The solder ball SB and the under-bump metal 11 may include a conductive material.

The first semiconductor structure 100 may include a first lower redistribution layer LRD1, a first die attach film (DAF) 122, a first semiconductor chip 110, a first connection post 121, a first chip post 123, a first molding layer 130, a first upper redistribution layer URD1, and a first interposition layer IP1. The solder ball SB may be electrically connected to the first lower redistribution layer LRD1. The solder dielectric layer IL may surround a portion of the under-bump metal 11.

The first lower redistribution layer LRD1 may be positioned on the under-bump metal 11. The first lower redistribution layer LRD1 may have a plate shape that extends along a plane elongated in a first direction D1 and a second direction D2. The first and second directions D1 and D2 may intersect each other. For example, the first and second directions D1 and D2 may be horizontal directions that are orthogonal to each other. The first lower redistribution layer LRD1 may include a redistribution pattern 103 and a redistribution dielectric layer 101 that surrounds the redistribution pattern 103. The first lower redistribution layer LRD1 may be connected to the first attach film 122 used to attach the first semiconductor chip 110 to the first lower redistribution layer LRD1. The first lower redistribution layer LRD1 may be electrically connected through the redistribution pattern 103 to the first connection post 121. The redistribution dielectric layer 101 may include a photosensitive dielectric material. The photosensitive dielectric material may include a polymer resin material, for example, at least one of a photo-imageable dielectric (PID) or a photo-acrylic. The redistribution pattern 103 may include an upper portion and a lower portion. The upper and lower portions of the redistribution pattern 103 may have different widths from each other. The upper and lower portions of the redistribution pattern 103 may be connected to have a single unitary structure with no boundary therebetween. The redistribution pattern 103 may include a conductive material.

The first die attach film 122 may be provided to fix the first semiconductor chip 110 to the first lower redistribution layer LRD1. The first die attach film 122 may be disposed on the first lower redistribution layer LRD1. The first die attach film 122 may be positioned between the first semiconductor chip 110 and the first lower redistribution layer LRD1. The first die attach film 122 may be in contact with a bottom surface of the first semiconductor chip 110 and a top surface of the first lower redistribution layer LRD1. In an embodiment, the first die attach film 122 may include at least one of an epoxy resin or a rubber resin.

The first semiconductor chip 110 may be positioned between the first lower redistribution layer LRD1 and the first upper redistribution layer URD1. The first semiconductor chip 110 may include an active layer 113 and a passivation layer 114 on the active layer 113. The active layer 114 may include silicon. The passivation layer 114 may include a chip conductive structure 116. In an embodiment, the chip conductive structure 116 may include a conductive material.

The chip conductive structure 116 may include, for example, a conductive contact, a conductive line, or a conductive pad. In an embodiment, the first semiconductor chip 110 may include a plurality of first semiconductor chips.

The first chip post 123 may be positioned on the passivation layer 114. The first chip post 123 may be disposed between the first semiconductor chip 110 and the first upper redistribution layer URD1. The first chip post 123 may connect the first upper redistribution layer URD1 to the first semiconductor chip 110. The first chip post 123 may include a metal, for example, copper. The first chip post 123 may have a width greater than that of the chip conductive structure 116. In an embodiment, the first semiconductor chip 110 may include a plurality of first semiconductor chips 110 and the first chip post 123 may include a plurality of first chip posts 123, and the first chip posts 123 may be provided on corresponding first semiconductor chips 110. In an embodiment, a plurality of first chip posts 123 may be provided on a single first semiconductor chip 110.

The first connection post 121 may be provided on the first lower redistribution layer LRD1. The first connection post 121 may be positioned spaced apart from the first semiconductor chip 110. The first connection post 121 may be provided between the first lower redistribution layer LRD1 and the first upper redistribution layer URD1. The first connection post 121 may electrically connect the first lower redistribution layer LRD1 to the first upper redistribution layer URD1. In an embodiment, the first connection post 121 may include metal such as copper. In an embodiment, the first connection post 121 may include a plurality of first connection posts.

The first molding layer 130 may be provided on the first lower redistribution layer LRD1. The first molding layer 130 may be provided on the first semiconductor chip 110. The first molding layer 130 may surround the first die attach film 122, the first semiconductor chip 110, the first chip post 123, and the first connection post 121. In an embodiment, the first molding layer 130 may include at least one of an epoxy resin or a phenolic resin.

The first upper redistribution layer URD1 may be provided on the first lower redistribution layer LRD1. The first upper redistribution layer URD1 may be provided on the first molding layer 130. The first upper redistribution layer URD1 may include a redistribution pattern 104 and a redistribution dielectric layer 102 that surrounds the redistribution pattern 104. The first upper redistribution layer URD1 may be provided on the first semiconductor chip 110. The first upper redistribution layer URD1 may be electrically connected through the redistribution pattern 104 to the first chip post 123. The redistribution dielectric layer 102 may include a photosensitive dielectric material. The first lower redistribution layer LRD1 and the first upper redistribution layer URD1 may be connected to the first connection post 121. The redistribution pattern 104 may include an upper portion and a lower portion. The upper and lower portions of the redistribution pattern 104 may have different widths from each other. The upper and lower portions of the redistribution pattern 104 may be connected to have a single unitary structure with no boundary therebetween.

The first interposition layer IP1 may be provided on the first upper redistribution layer URD1. The first interposition layer IP1 may include a conductive structure 106 and an interposition dielectric layer 105 that surrounds the conductive structure 106. The conductive structure 106 of the first interposition layer IP1 may include a conductive contact, a conductive line, or a conductive pad. In an embodiment, the conductive structure 106 of the first interposition layer IP1 may include a lower conductive structure and an upper conductive structure that are connected to each other. A boundary may be provided between the lower conductive structure and the upper conductive structure. The upper and lower conductive structures may have different widths from each other.

The second semiconductor structure 200 may be disposed on the first semiconductor structure 100. The second semiconductor structure 200 may include a second interposition layer IP2, a second lower redistribution layer LRD2, a second semiconductor chip 210, a second die attach film 222, a second connection post 221, a second chip post 223, a second molding layer 230, and a second upper redistribution layer URD2.

The second interposition layer IP2 may be provided on the first interposition layer IP1. The second interposition layer IP2 may include a conductive structure 206 and an interposition dielectric layer 205 that surrounds the conductive structure 206. The conductive structure 206 of the second interposition layer IP2 may include a conductive contact, a conductive line, or a conductive pad. In an embodiment, the conductive structure 206 of the second interposition layer IP2 may include a lower conductive structure and an upper conductive structure that are connected to each other.

In an embodiment, the interposition dielectric layers 105 and 205 may be inorganic dielectric layers. In an embodiment, the interposition dielectric layers 105 and 205 may include, for example, SiO2, Si3N4, or $Al_2O_3$. In an embodiment, the conductive structures 106 and 206 may include at least one of copper, tungsten, tantalum, titanium, or aluminum.

The first semiconductor structure 100 and the second semiconductor structure 200 may be physically connected through the first interposition layer IP1 and the second interposition layer IP2. The first semiconductor structure 100 and the second semiconductor structure 200 may be electrically connected through the conductive structure 106 of the first interposition layer IP1 and the conductive structure 206 of the second interposition layer IP2. In an embodiment, the first semiconductor structure 100 and the second semiconductor structure 200 may be connected due to metal-metal diffusion between the conductive structure 106 of the first interposition layer IP1 and the conductive structure 206 of the second interposition layer IP2.

The second lower redistribution layer LRD2 may be provided on the second interposition layer IP2. The second lower redistribution layer LRD2 may have a plate shape that extends along a plane elongated in the first direction D1 and the second direction D2. The second lower redistribution layer LRD2 may include a redistribution pattern 203 and a redistribution dielectric layer 201 that surrounds the redistribution pattern 203.

The second lower redistribution layer LRD2 may be connected to the second chip post 223. The second lower redistribution layer LRD2 may be electrically connected through the redistribution pattern 203 to the second connection post 221. The redistribution dielectric layer 201 may include a photosensitive dielectric material. The redistribution pattern 203 may include an upper portion and a lower portion. The upper and lower portions of the redistribution pattern 203 may have different widths from each other. The upper and lower portions of the redistribution pattern 203 may be connected to have a single unitary structure with no boundary therebetween.

The second die attach film 222 may be provided to fix the second semiconductor chip 210 to the second upper redistribution layer URD2. The second die attach film 222 may be positioned between the second semiconductor chip 210 and the second upper redistribution layer URD2. The second die attach film 222 may be in contact with a top surface of the second semiconductor chip 210 and a bottom surface of the second upper redistribution layer URD2. In an embodiment, the second die attach film 222 may include at least one of an epoxy resin or a rubber resin. In an embodiment, the second die attach film 222 may be provided to fix the second semiconductor chip 210 to the second lower redistribution layer LRD2. In this case, the second die attach film 222 may be positioned between the second semiconductor chip 210 and the second lower redistribution layer LRD2, and may be in contact with a bottom surface of the second semiconductor chip 210 and a top surface of the second lower redistribution layer LRD2.

The second semiconductor chip 210 may be positioned between the second lower redistribution layer LRD2 and the second upper redistribution layer URD2. The second semiconductor chip 210 may include an active layer 213 and a passivation layer 214 on the active layer 213. The active layer 213 may include silicon. The passivation layer 214 may include a chip conductive structure 216. In an embodiment, the chip conductive structure 216 may include a conductive material. In an embodiment, the chip conductive structure 216 may include a conductive contact, a conductive line, or a conductive pad. In an embodiment, the second semiconductor chip 210 may include a plurality of second semiconductor chips.

The second chip post 223 may be positioned on the second lower redistribution layer LRD2. The second chip post 223 may include a metal, for example, copper. The second chip post 223 may have a width greater than that of the chip conductive structure 216. The second semiconductor chip 210 may include a plurality of second semiconductor chips 210 and the second chip post 223 may include a plurality of second chip posts 223. In an embodiment, the second chip posts 223 may be provided on corresponding redistribution patterns 203 of the second lower redistribution layer LRD2. In an embodiment, the second chip posts 223 may be correspondingly in contact with the chip conductive structures 216 of the second semiconductor chips 210.

In an embodiment, the second chip post 223 may be disposed between the second semiconductor chip 210 and the second upper redistribution layer URD2. In an embodiment, the second chip post 223 may connect the second upper redistribution layer URD2 to the second semiconductor chip 210.

The second connection post 221 may be provided on the second lower redistribution layer LRD2. The second connection post 221 may be positioned spaced apart from the second semiconductor chip 210. The second connection post 221 may be provided between the second lower redistribution layer LRD2 and the second upper redistribution layer URD2. The second connection post 221 may electrically connect the second lower redistribution layer LRD2 to the second upper redistribution layer URD2. In an embodiment, the second connection post 221 may include a metal such as copper. In an embodiment, the second connection post 221 may include a plurality of second connection posts.

The second molding layer 230 may be provided on the second lower redistribution layer LRD2. In an embodiment, the second semiconductor chip 210 may be provided on the second molding layer 230. In an embodiment, the second molding layer 230 may be provided on the second semiconductor chip 210. The second molding layer 230 may surround the second die attach film 222, the second semiconductor chip 210, the second chip post 223, and the second connection post 221. In an embodiment, the second molding layer 230 may include at least one of an epoxy resin or a phenolic resin.

The second upper redistribution layer URD2 may be provided on the second lower redistribution layer LRD2. The second upper redistribution layer URD2 may be provided on the second molding layer 230. The second upper redistribution layer URD2 may include a redistribution pattern 204 and a redistribution dielectric layer 202 that surrounds the redistribution pattern 204. The second upper redistribution layer URD2 may be provided on the second semiconductor chip 210. The redistribution dielectric layer 202 may include a photosensitive dielectric material. The second lower redistribution layer LRD2 and the second upper redistribution layer URD2 may be connected to the second connection post 221. In an embodiment, the second upper redistribution layer URD2 may be configured such that the redistribution dielectric layer 202 may cover the redistribution pattern 204 so as not to expose the redistribution pattern 204. The redistribution pattern 204 may include an upper portion and a lower portion. The upper and lower portions of the redistribution pattern 204 may have different widths from each other. The upper and lower portions of the redistribution pattern 204 may be connected to have a single unitary structure with no boundary therebetween.

In an embodiment, the first connection post 121 may overlap in the third direction D3 with the second semiconductor chip 210, and the second connection post 221 may overlap in the third direction D3 with the first semiconductor chip 110.

In an embodiment, two first semiconductor chips 110 may be disposed between two first connection posts 121, and two second connection posts 221 may be disposed between two second semiconductor chips 210. In an embodiment, an interval between the first connection posts 121 may range from about 0.001 mm to about 1 mm. In an embodiment, an interval between the first semiconductor chips 110 may range from about 0.001 mm to about 1 mm. In an embodiment, a value of 0.001 mm to about 1 mm may be given to an interval between the first connection post 121 and its adjacent first semiconductor chip 110. In an embodiment, a value of about 0.001 mm to about 1 mm may be given to an interval between the first semiconductor chip 110 and the first upper redistribution layer URD1.

The semiconductor package according to some embodiments may include a memory semiconductor chip and a logic semiconductor chip. The logic semiconductor chip may be disposed in the first semiconductor structure 100 or the second semiconductor structure 200. As the position of the logic semiconductor chip is changed, the semiconductor package may become optimized in terms of electrical connection distance.

In the semiconductor package according to some embodiments, the first connection post 121 may overlap the second semiconductor chip 210, and the second connection post 221 may overlap the first semiconductor chip 110. Accordingly, the semiconductor package may have a relatively large stacking density.

FIGS. 2A, 2B, 2C, 2D, 2E, and 2F illustrate cross-sectional views showing a method of fabricating the semiconductor package depicted in FIGS. 1A to 1C, according to some embodiments.

Figure 2A:
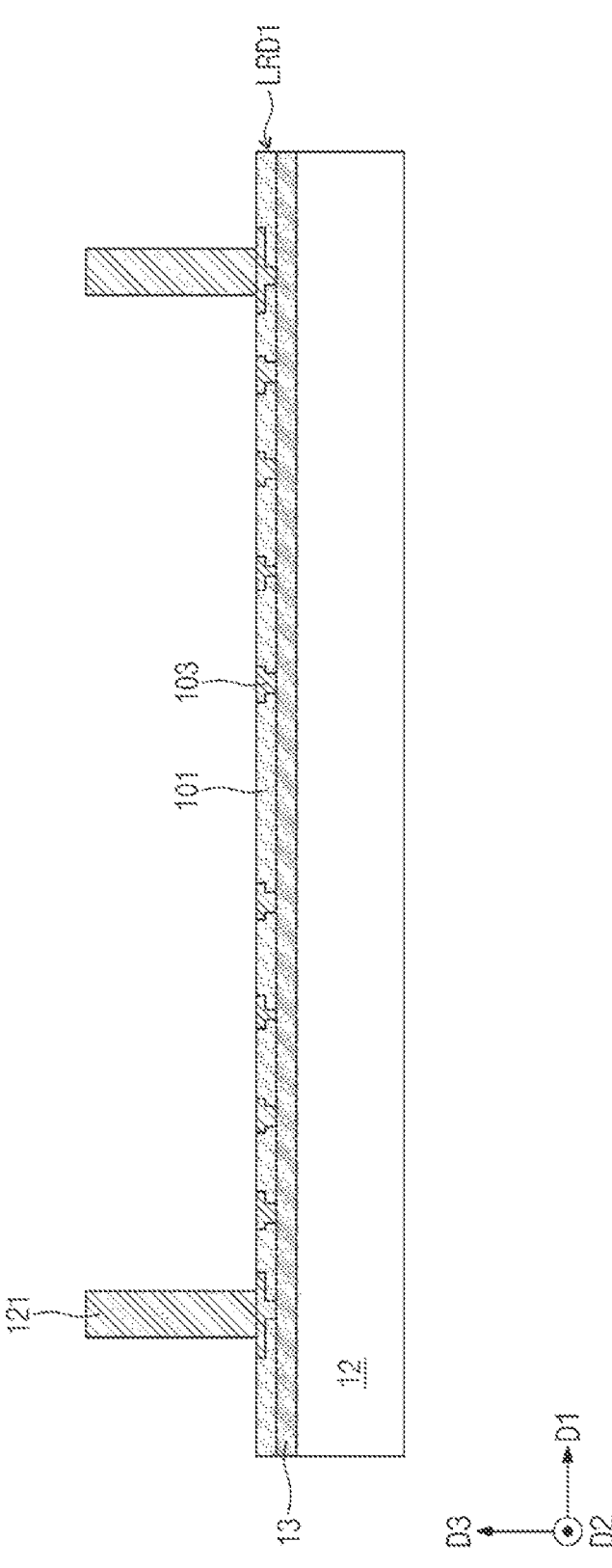
FIGS. 2A, 2B, 2C, 2D, 2E, and 2F illustrate cross-sectional views showing a method of fabricating the semiconductor package depicted in FIGS. 1A to 1C, according to some embodiments.

Referring to FIG. 2A, a first glue layer 13 may be provided on a first substrate 12. A first lower redistribution layer LRD1 may be formed on the first glue layer 13. The first lower redistribution layer LRD1 may include a redistribution dielectric layer 101 and a redistribution pattern 103. The redistribution pattern 103 may be formed in the redistribution dielectric layer 101. In an embodiment, the redistribution pattern 103 may be formed by etching lower and upper portions having different widths from each other, and then performing a plating process.

A first connection post 121 may be formed on the first lower redistribution layer LRD1. In an embodiment, the first connection post 121 may be formed by a photolithography process and a plating process. The first connection post 121 may be formed to electrically connect to the redistribution pattern 103. In an embodiment, a plurality of first connection posts 121 may be formed on the first lower redistribution layer LRD1.

Figure 2B:
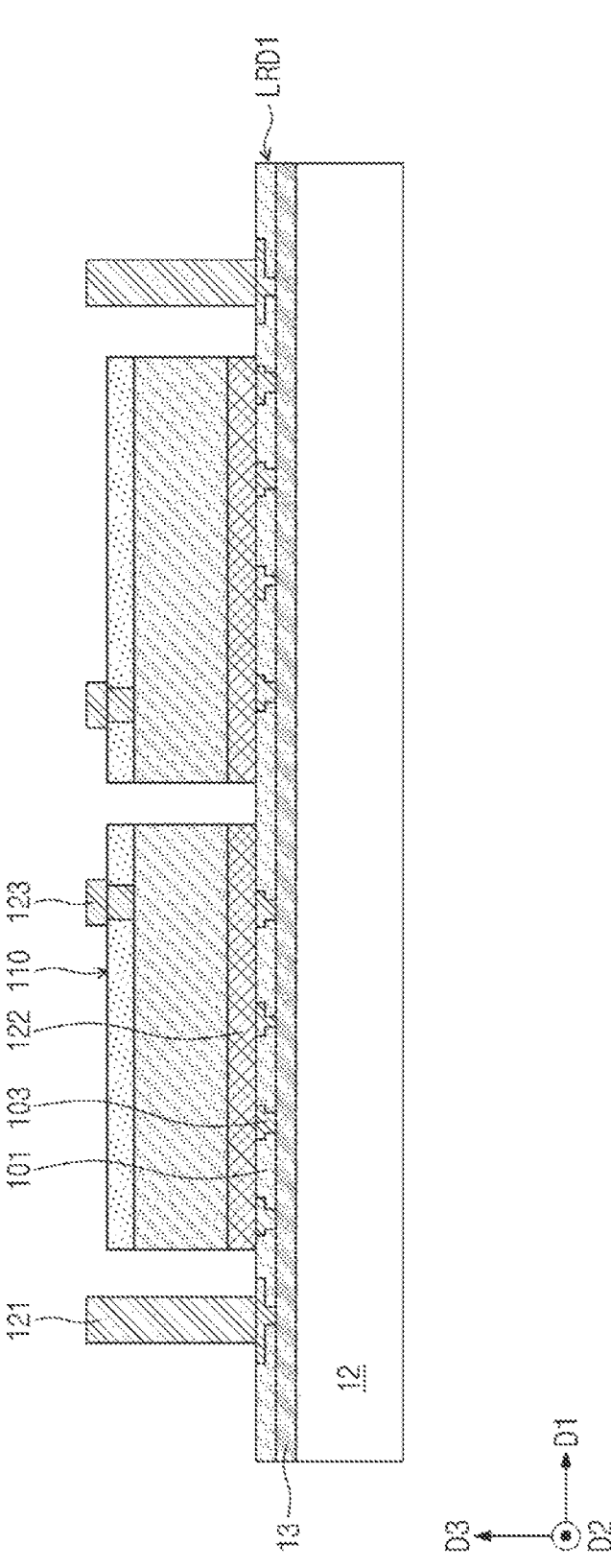

Referring to FIG. 2B, a first semiconductor chip 110 may be formed, and a first die attach film 122 and a first chip post 123 may be formed to connect to the first semiconductor chip 110. The first semiconductor chip 110 connected to the first chip post 123 may be disposed on the first lower redistribution layer LRD1. The first semiconductor chip 110 may be disposed spaced apart from the first connection post 121.

Figure 2C:
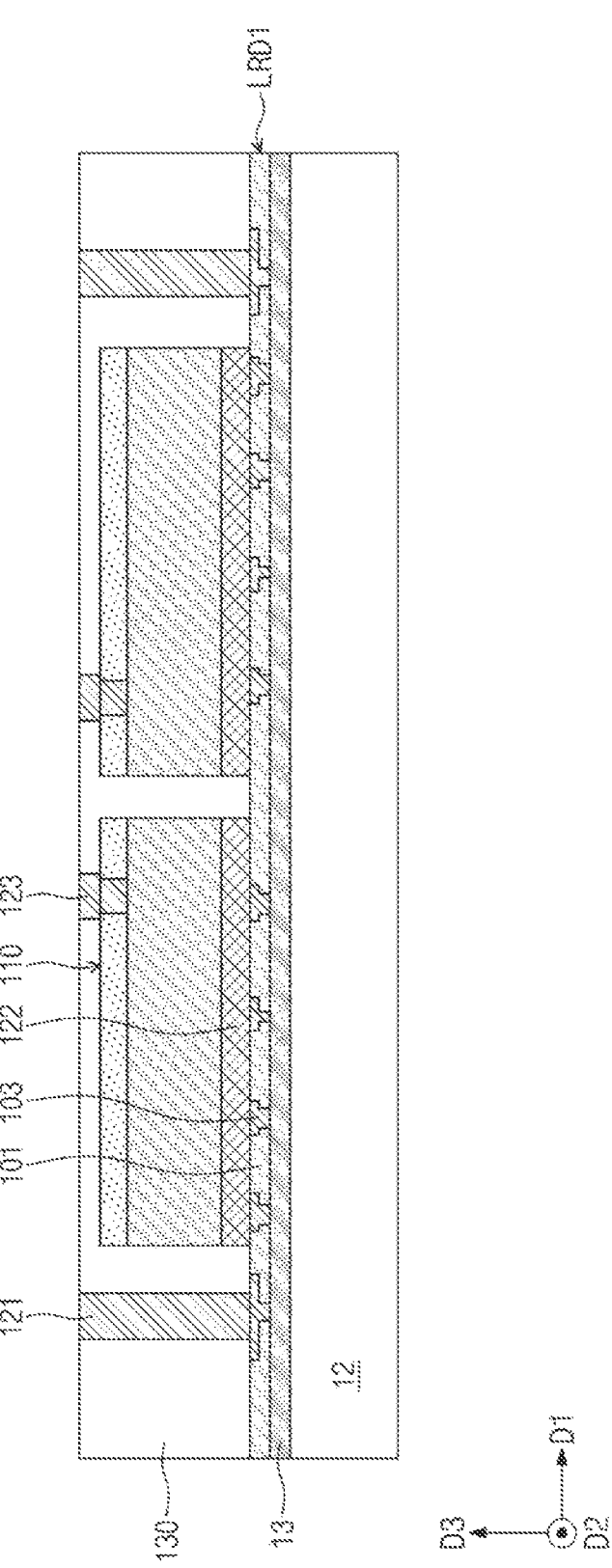

Referring to FIG. 2C, a first molding layer 130 may be formed on the first lower redistribution layer LRD1. The first molding layer 130 may surround the first connection post 121, the first semiconductor chip 110, the first die attach film 122, and the first chip post 123. The formation of the first molding layer 130 may include forming a molding material layer that covers the first connection post 121, the first semiconductor chip 110, the first die attach film 122, and the first chip post 123, and performing a grinding process to expose the first connection post 121 and the first chip post 123.

Figure 2D:
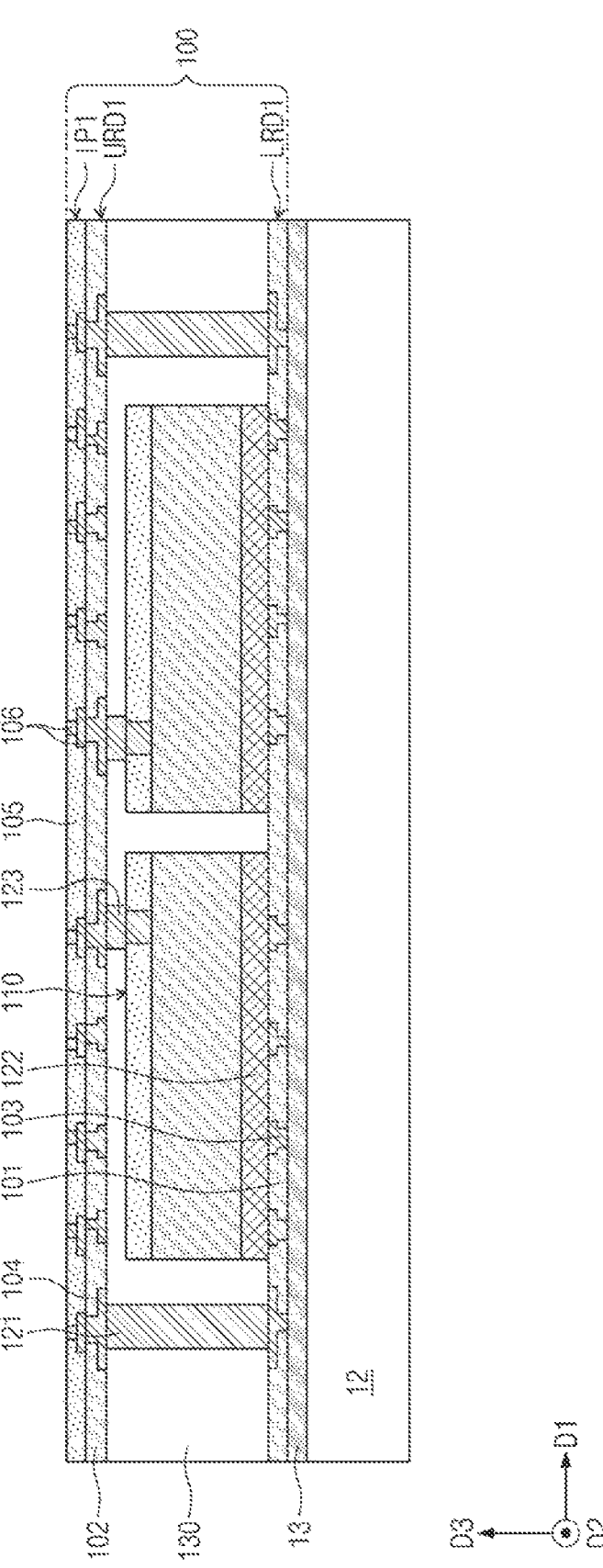

Referring to FIG. 2D, a first upper redistribution layer URD1 may be formed in the first molding layer 130. The first upper redistribution layer URD1 may include a redistribution dielectric layer 102 and a redistribution pattern 104. The redistribution pattern 104 may be formed in the redistribution dielectric layer 102. In an embodiment, the redistribution pattern 104 may be formed by etching its lower and upper portions having different widths from each other, and then performing a plating process. The redistribution pattern 104 may be electrically connected to the first connection post 121. The redistribution pattern 104 may be electrically connected to the first chip post 123.

A first interposition layer IP1 may be formed on the first upper redistribution layer URD1. The first interposition layer IP1 may include an interposition dielectric layer 105 and conductive structures 106. The interposition dielectric layer 105 may surround the conductive structures 106. A first semiconductor structure may be formed to include the first lower redistribution layer LRD1, the first connection post 121, the first semiconductor chip 110, the first chip post 123, the first upper redistribution layer URD1, and the first interposition layer IP1.

Figure 2E:
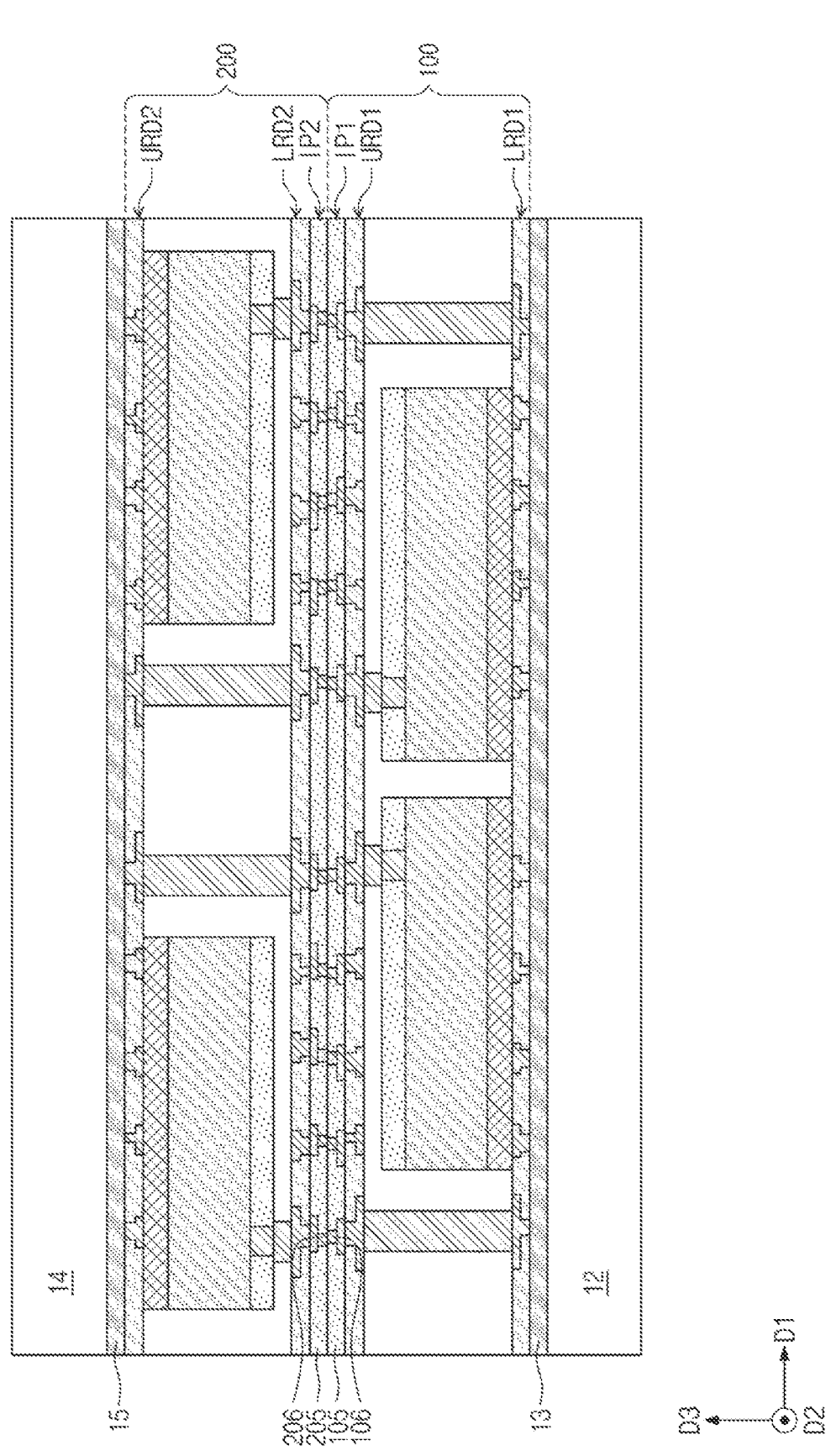

Referring to FIG. 2E, similar to the formation of the first semiconductor structure 100, a second semiconductor structure 200 may be formed on a second substrate 14 and a second glue layer 15. The second semiconductor structure 200 may include a second lower redistribution layer LRD2, a second connection post 221, a second chip post 223, a second semiconductor chip 210, a second upper redistribution layer URD2, and a second interposition layer IP2.

The second semiconductor structure 200 may be bonded to the first semiconductor structure 100. The first interposition layer IP1 of the first semiconductor structure 100 may be bonded to the second interposition layer IP2 of the second semiconductor structure 200. The conductive structure 106 of the first interposition layer IP1 may be bonded to a conductive structure 206 of the second interposition layer IP2. In an embodiment, an annealing process may be performed after the bonding between the conductive structure 106 of the first interposition layer IP1 and the conductive structure 206 of the second interposition layer IP2.

In an embodiment, the second semiconductor structure 200 and the first semiconductor structure 100 may be bonded to cause the first connection post 121 to overlap in a third direction D3 with the second semiconductor chip 210 and the second connection post 221 to overlap in the third direction D3 with the first semiconductor chip 110.

Figure 2F:
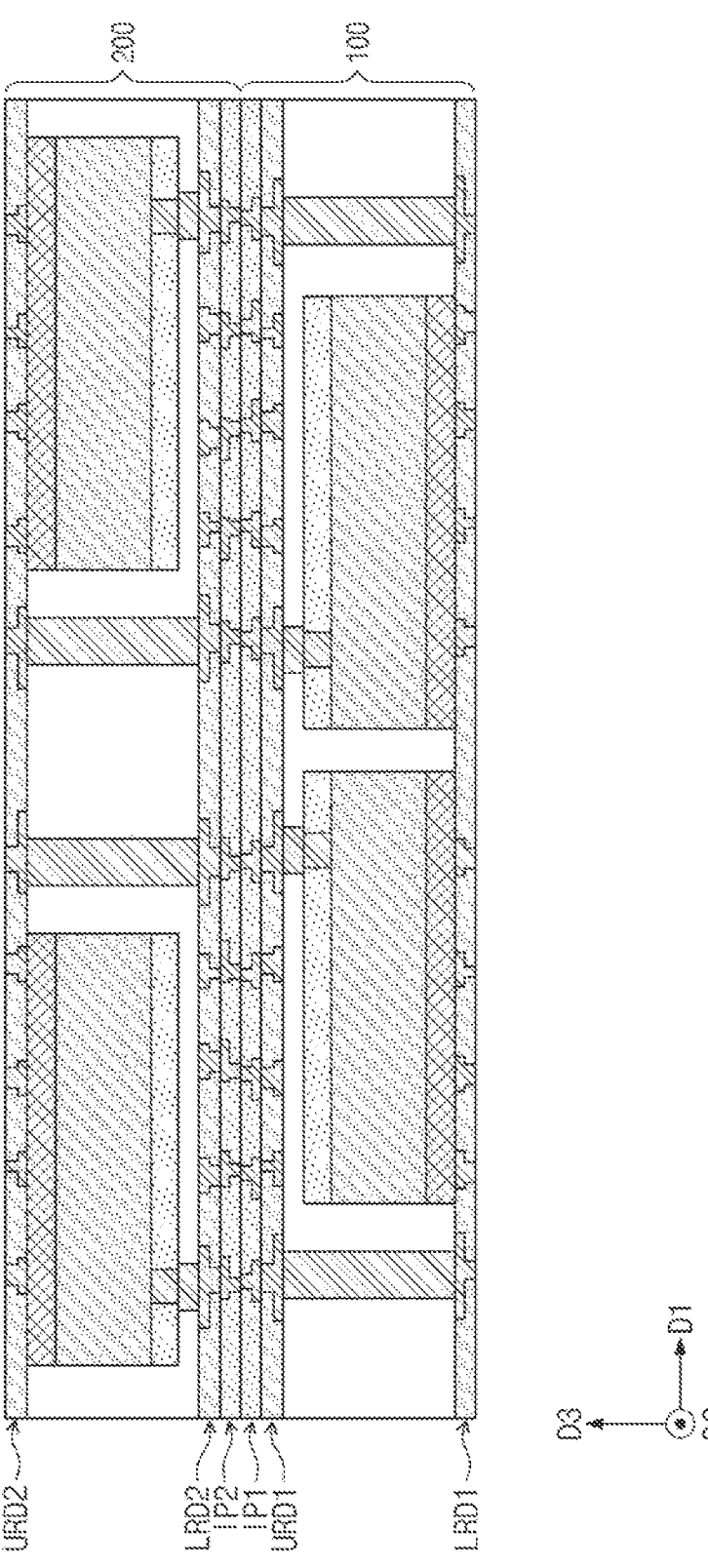

Referring to FIG. 2F, the first substrate 12 and the first glue layer 13 may be removed, and the second substrate 14 and the second glue layer 15 may be removed.

Referring to FIG. 1A, a solder ball SB and an under-bump metal (UBM) 11 may be formed to connect to the first lower redistribution layer LRD1 of the first semiconductor structure 100. In an embodiment, a redistribution dielectric layer 202 may be additionally coated on the second upper redistribution layer URD so as not to expose a redistribution pattern 204.

Figure 3:
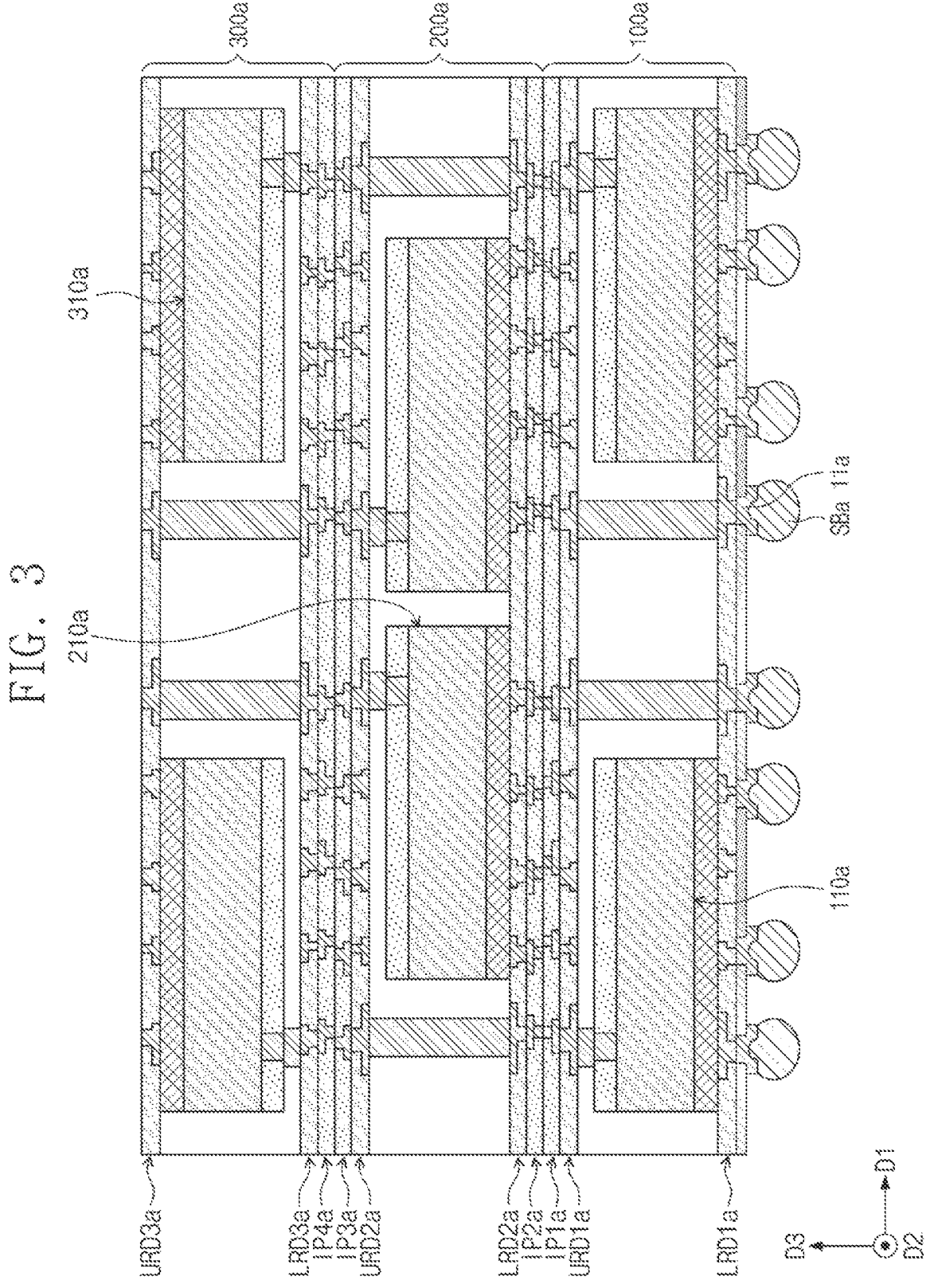
FIG. 3 illustrates a cross-sectional view showing a semiconductor package according to some embodiments.

FIG. 3 illustrates a cross-sectional view showing a semiconductor package according to some embodiments.

Referring to FIG. 3, a semiconductor package may include a solder ball SBa, an under-bump metal (UBM) 11a, a first semiconductor structure 100a on the under-bump metal 11a, a second semiconductor structure 200a on the first semiconductor structure 100a, and a third semiconductor structure 300a on the second semiconductor structure 200a.

Similar to the first semiconductor structure 100 of FIG. 1A, the first semiconductor structure 100a may include a first lower redistribution layer LRD1a, a first upper redistribution layer URD 1a on the first lower redistribution layer LRD1a, a first semiconductor chip 110a between the first lower redistribution layer LRD1a and the first upper redistribution layer URD1a, and a first interposition layer IP1a on the first upper redistribution layer URD1a.

The second semiconductor structure 200a may include a second interposition layer IP2a on the first interposition layer IP1a, a second lower redistribution layer LRD2a on the second interposition layer IP2a, a second upper redistribution layer URD2a on the second lower redistribution layer LRD2a, a second semiconductor chip 210a between the second lower redistribution layer LRD2a and the second upper redistribution layer URD2a, and a third interposition layer IP3a on the second upper redistribution layer URD2a.

Similar to the second semiconductor structure 200 of FIG. 1A, the third semiconductor structure 300a may include a fourth interposition layer IP4a on the third interposition layer IP3a, a third lower redistribution layer LRD3a on the fourth interposition layer IP4a, a third upper redistribution layer URD3a on the third lower redistribution layer LRD3a, and a third semiconductor chip 310a between the third lower redistribution layer LRD3a and the third upper redistribution layer URD3a.

The first interposition layer IP1a of the first semiconductor structure 100a may be bonded to the second interposition layer IP2a of the second semiconductor structure 200a. The third interposition layer IP3a of the second semiconductor structure 200a may be bonded to the fourth interposition layer IP4a of the third semiconductor structure 300a.

Figure 4A:
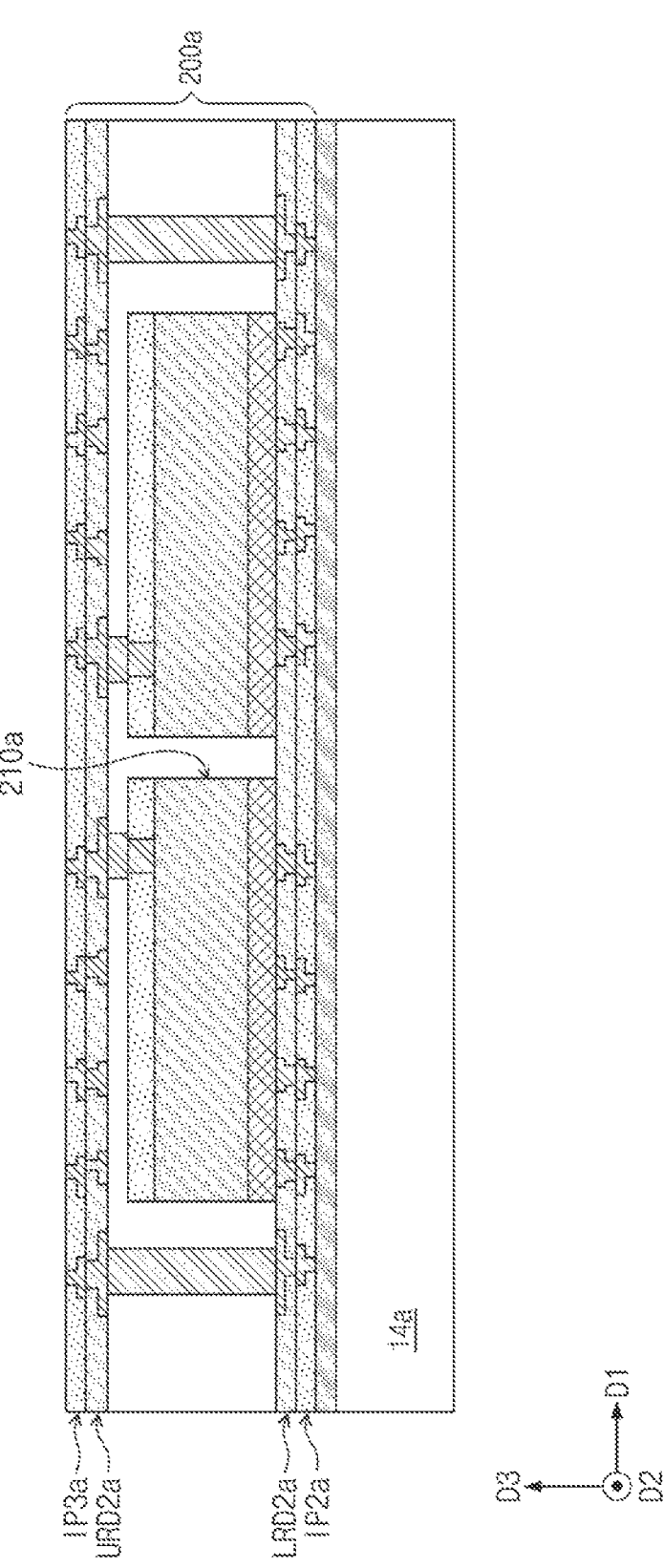
FIGS. 4A and 4B illustrate cross-sectional views showing a method of fabricating the semiconductor package depicted in FIG. 3, according to some embodiments.
Figure 4B:
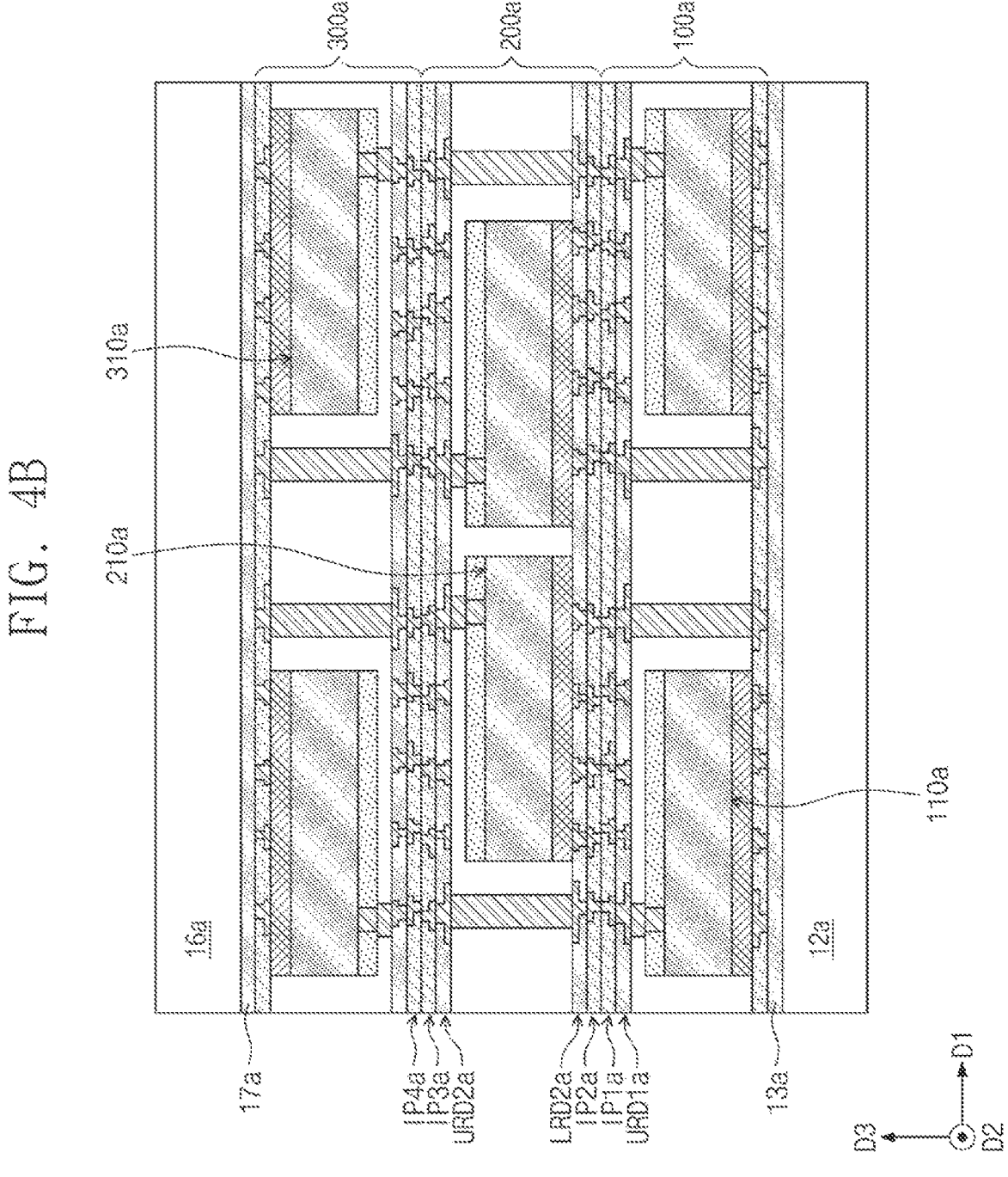

FIGS. 4A and 4B illustrate cross-sectional views showing a method of fabricating the semiconductor package depicted in FIG. 3.

Referring to FIG. 4A, similar to that discussed with reference to FIGS. 2A to 2D, a first semiconductor structure 100a may be formed. A second glue layer 15a may be formed on a second substrate 14a, and a second semiconductor structure 200a may be formed on the second glue layer 15a. In an embodiment, the formation of the second semiconductor structure 200a may be followed by the formation of the first semiconductor structure 100a.

Referring to FIG. 4B, the second semiconductor structure 200a may be bonded to the first semiconductor structure 100a. Afterwards, the second substrate 14a and the second glue layer 15a may be removed.

Similar to that discussed with reference to FIGS. 2A to 2D, a third semiconductor structure 300a may be formed on a third substrate 16a and a third glue layer 17a. Thereafter, the third semiconductor structure 300a may be bonded to the second semiconductor structure 200a.

Referring to FIG. 3, the first and third substrates 12a and 16a may be removed, and the first and third glue layers 13a and 17a may also be removed. A solder ball SBa and an under-bump metal (UBM) 11a may be formed to connect to the first lower redistribution layer LRD1a of the first semiconductor structure 100a. In an embodiment, a redistribution dielectric layer may additionally be coated not to expose a redistribution pattern on a third upper redistribution layer URD3a. In an embodiment, a sawing process may be performed to obtain a semiconductor package that is separated to have a desired size.

Figure 5A:
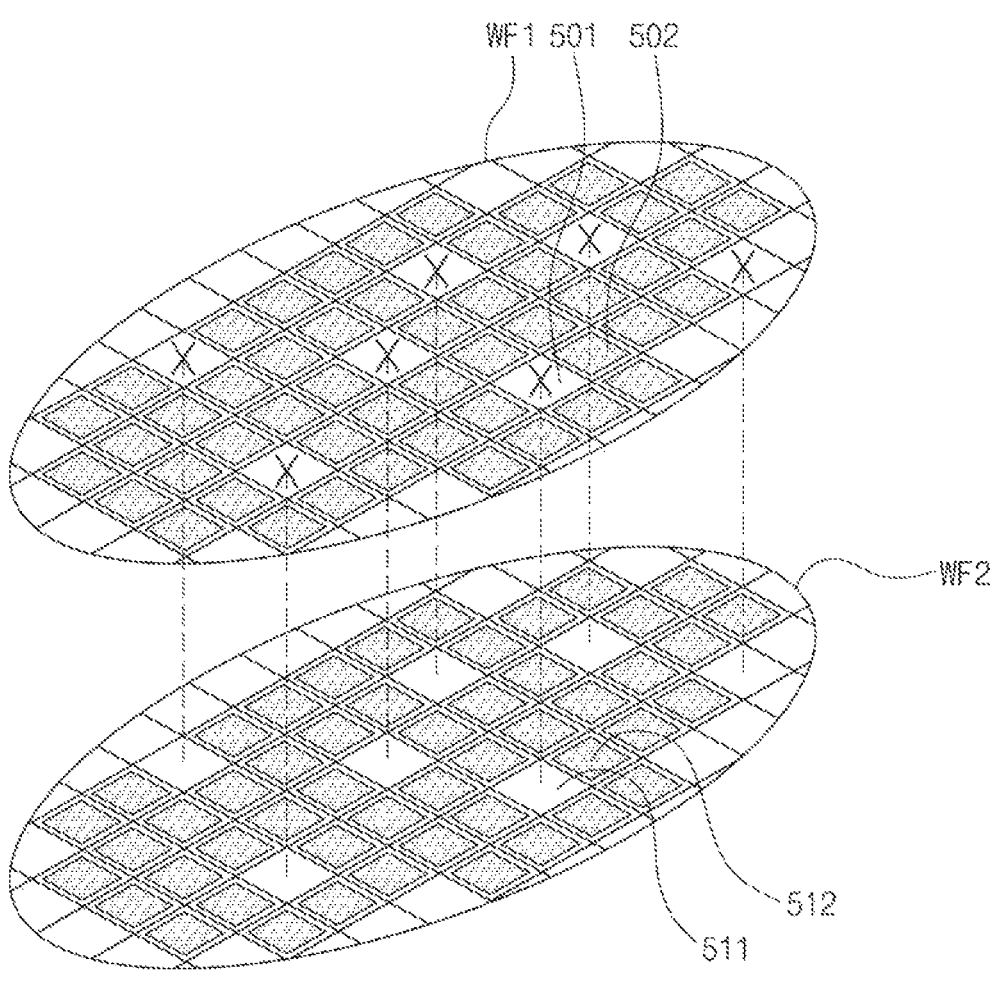
FIG. 5A illustrates a conceptual view showing a wafer stacking process according to some embodiments.

FIG. 5A illustrates a conceptual view showing a wafer stacking process according to some embodiments.

Referring to FIG. 5A, a first wafer WF1 and a second wafer WF2 may be provided. The second wafer WF2 and the first wafer WF1 may be computationally paired with each other. The first wafer WF1 and the second wafer WF2 may be bonded by a wafer-to-wafer process. The first wafer WF1 and the second wafer WF2 may be stacked by a wafer-to-wafer process. The first wafer WF1 may be first fabricated. A normally operated semiconductor chip 502 may be mounted on the first wafer WF1. The first wafer WF1 may include a reject position 501. As used here, "normally operated" denotes a semiconductor chip 502 that does not have sufficient defects to prevent operation of the semiconductor chip 502 for the intended operation of the semiconductor chip 502.

The fabrication of the first wafer WF1 may be followed by the fabrication of the second wafer WF2. A normally operated semiconductor chip 512 may be mounted on the second wafer WF2. The second wafer WF2 may include a non-mount position 511 on which no semiconductor chip is mounted. When stacking the first and second wafers WF1 and WF2, the semiconductor chip 512 on the second wafer WF2 may be mounted on a location on the second wafer WF2, which location corresponds to a position of the semiconductor chip 502 on the first wafer WF1. When stacking the first and second wafers WF1 and WF2, the non-mount position 511 of the second wafer WF2 may be a location on the second wafer WF2, which location corresponds to the reject position 501 of the first wafer WF1.

The reject position 501 of the first wafer WF1 may be placed on the non-mount position 511 of the second wafer WF2, and a location where the semiconductor chip 502 is mounted on the first wafer WF1 is mounted may be placed on a location where the semiconductor chip 512 is mounted on the second wafer WF2.

The second wafer WF2 may be provided thereon with no semiconductor chip on its location that corresponds to the reject position 501 of the first wafer WF1 (or, the second wafer WF2 may be provided with the non-mount position 511 thereon), it may be possible to prevent yield loss and to achieve maximization of production.

Figure 5B:
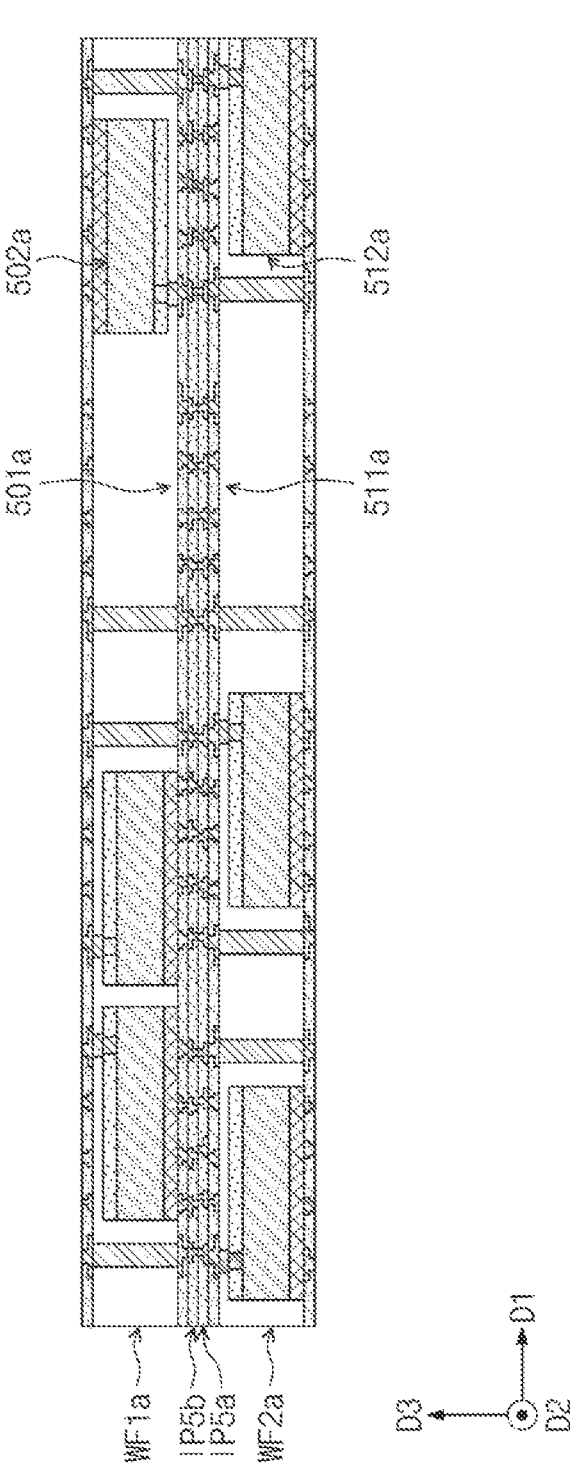
FIG. 5B illustrates a cross-sectional view showing stacked wafers fabricated by the process depicted in FIG. 5A, according to some embodiments.

FIG. 5B illustrates a cross-sectional view showing stacked wafers fabricated by the process depicted in FIG. 5A, according to some embodiments.

Referring to FIG. 5B, a first wafer WF1a and a second wafer WF2a may be stacked as discussed with respect to FIG. 5A. A normally operated semiconductor chip 502a may be mounted on the first wafer WF1a. The first wafer WF1a may be provided thereon with a reject position 501a on which no semiconductor chip is mounted. A wiring error may cause no semiconductor chip to reside on the reject position 501a.

A normally operated semiconductor chip 512a may be mounted on the second wafer WF2a. The second wafer WF2 may include a non-mount position 511a on which no semiconductor chip is mounted.

The first wafer WF1a and the second wafer WF2a may be in contact with each other through an interposition layer IP5b of the first wafer WF1a and an interposition layer IP5a of the second wafer WF2a.

When the first and second wafers WF1a and WF2a are in contact with each other, the reject position 501a of the first wafer WF1a may be located on the non-mount position 511a of the second wafer WF2a.

When the first and second wafers WF1a and WF2a are in contact with each other, a location where the semiconductor chip 502a is mounted on the first wafer WF1a may be placed on a location where the semiconductor chip 512a is mounted on the second wafer WF2a.

Figure 5C:
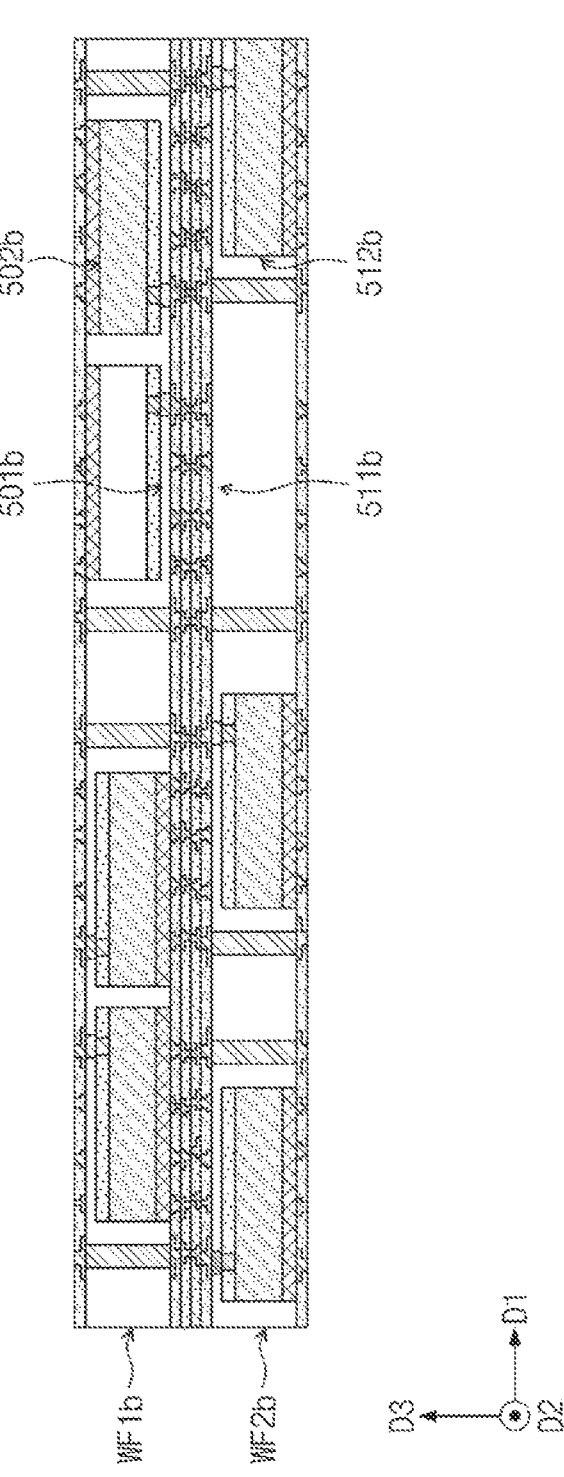
FIG. 5C illustrates a cross-sectional view showing stacked wafers fabricated by the process depicted in FIG. 5A, according to some embodiments.

FIG. 5C illustrates a cross-sectional view showing stacked wafers fabricated by the process depicted in FIG. 5A, according to some embodiments.

Referring to FIG. 5C, a first wafer WF1b and a second wafer WF2b may be stacked as discussed in FIG. 5A. A normally operated semiconductor chip 502b may be mounted on the first wafer WF1b. The first wafer WF1b may be provided thereon with a reject position on which an abnormally operated semiconductor chip 501b is mounted.

A normally operated semiconductor chip 512b may be mounted on the second wafer WF2b. The second wafer WF2b may include a non-mount position 511b on which no semiconductor chip is mounted.

When the first and second wafers WF1b and WF2b are in contact with each other, the reject position on which the abnormally operated semiconductor chip 501b is mounted on the first wafer WF1b may be located on the non-mount position 511b of the second wafer WF2b.

When the first and second wafers WF1b and WF2b are in contact with each other, a location of the semiconductor chip 502b on the first wafer WF1b may be placed on a location where the semiconductor chip 512b is mounted on the second wafer WF2b.

Figure 6:
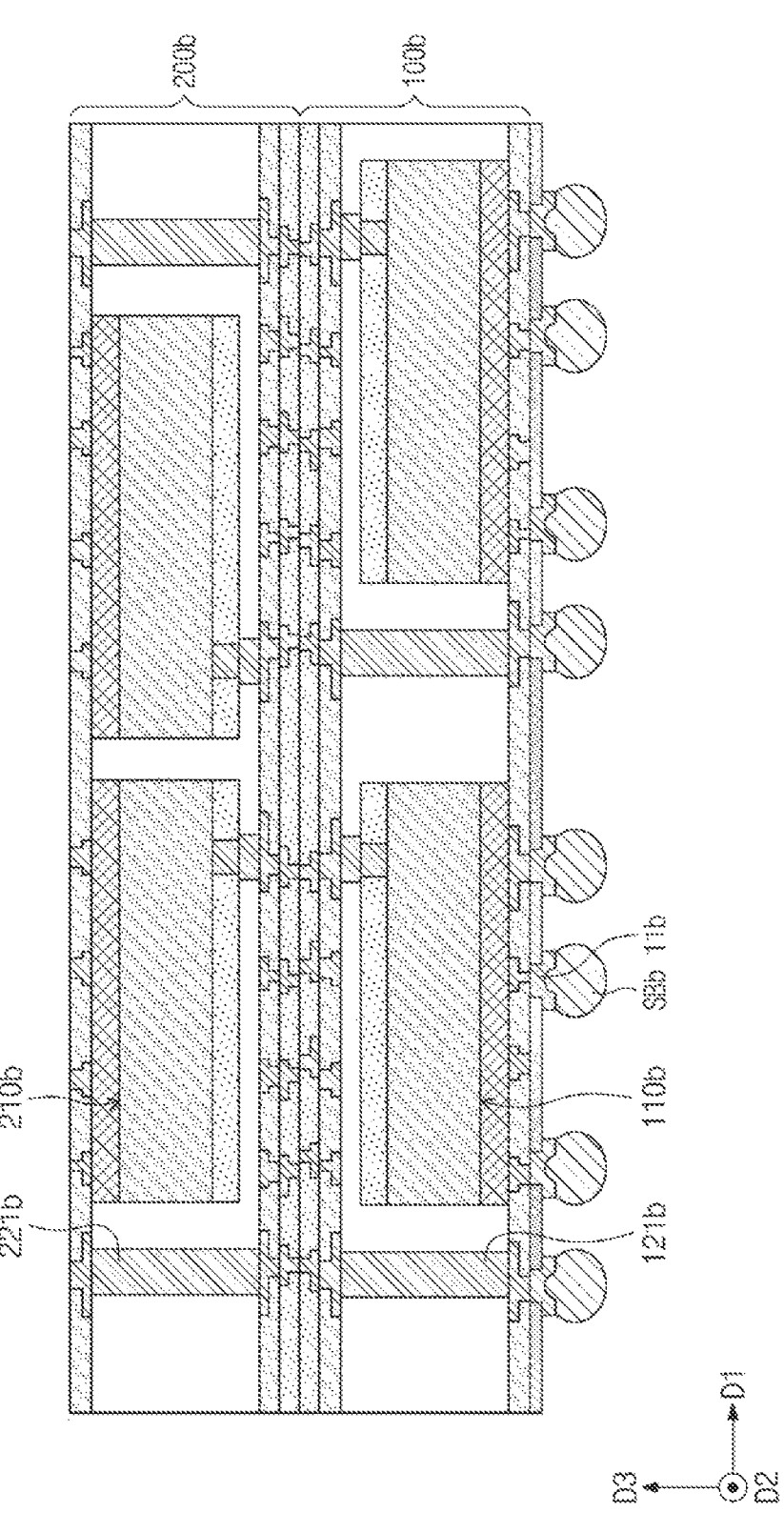
FIG. 6 illustrates a cross-sectional view showing a semiconductor package according to some embodiments.

FIG. 6 illustrates a cross-sectional view showing a semiconductor package according to some embodiments.

Referring to FIG. 6, a semiconductor package may include a solder ball SBb, an under-bump metal (UBM) 11b, a first semiconductor structure 100b on the under-bump metal 11b, and a second semiconductor structure 200b on the first semiconductor structure 100b.

One of first connection posts 121b may overlap in the a third direction D3 with one of the second connection posts 221b, and another of first connection posts 121b may overlap in the third direction D3 with a second semiconductor chip 210. One of first semiconductor chips 110b may be positioned between adjacent ones of the first connection posts 121b. A plurality of second semiconductor chips 210b may be positioned between adjacent ones of the second connection posts 221b. The plurality of second semiconductor chips 210b may be positioned adjacent to each other.

Figure 7:
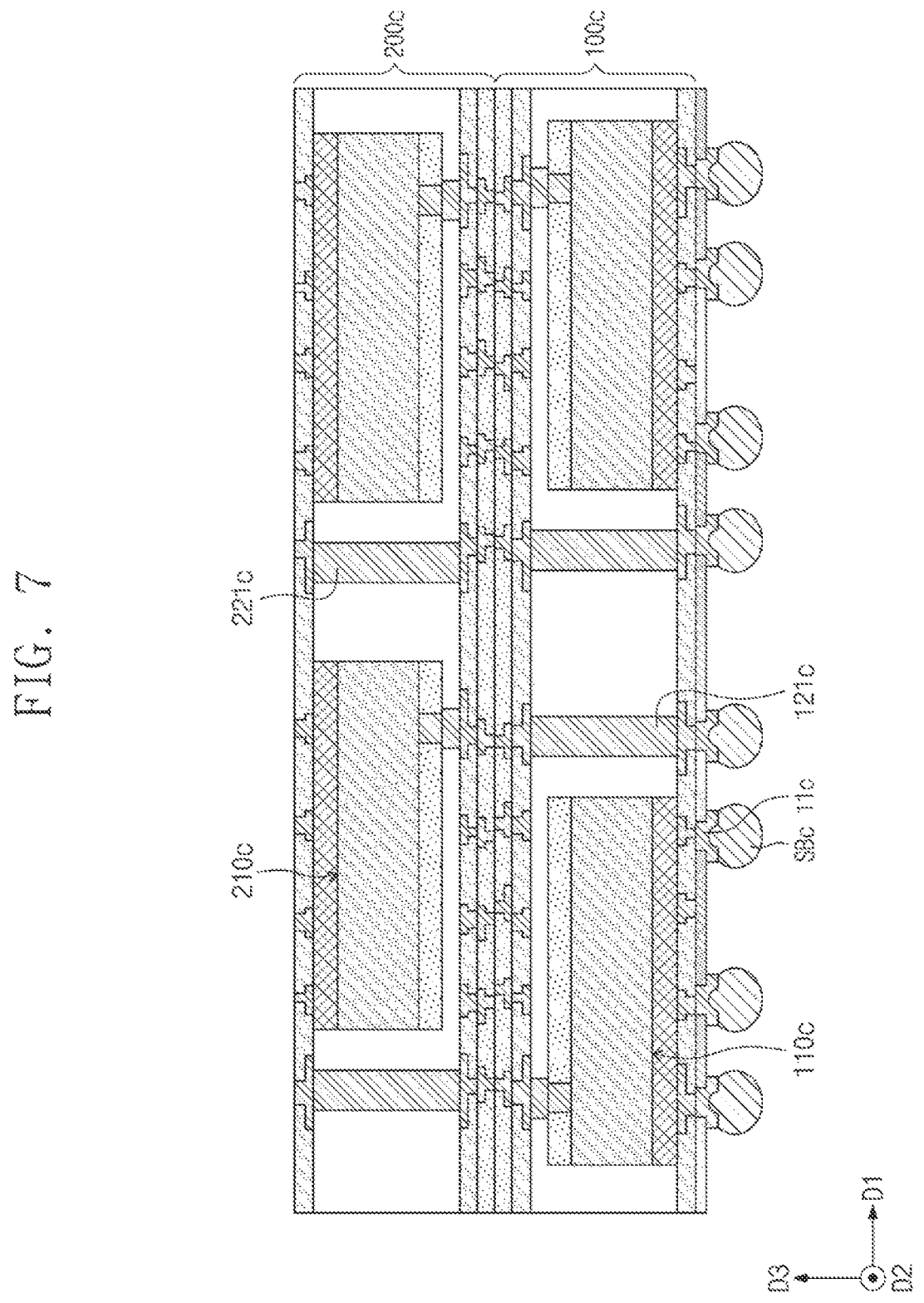

FIG. 7 illustrates a cross-sectional view showing a semiconductor package according to some embodiments.

Referring to FIG. 7, a semiconductor package may include a solder ball SBc, an under-bump metal (UBM) 11c, a first semiconductor structure 100c of the under-bump metal 11c, and a second semiconductor structure 200c on the first semiconductor structure 100c.

One of first connection posts 121c may overlap in a third direction D3 with one of second semiconductor chips 210c, and another of first connection posts 121c may overlap with and electrically connect to a portion of one of second connection post 221c. A plurality of first connection posts 121c may be positioned between adjacent ones of first semiconductor chips 110c. A plurality of first connection posts 121c may be positioned adjacent to each other. One of the second semiconductor chips 210c may be positioned between adjacent ones of the second connection posts 221c.

Figure 8:
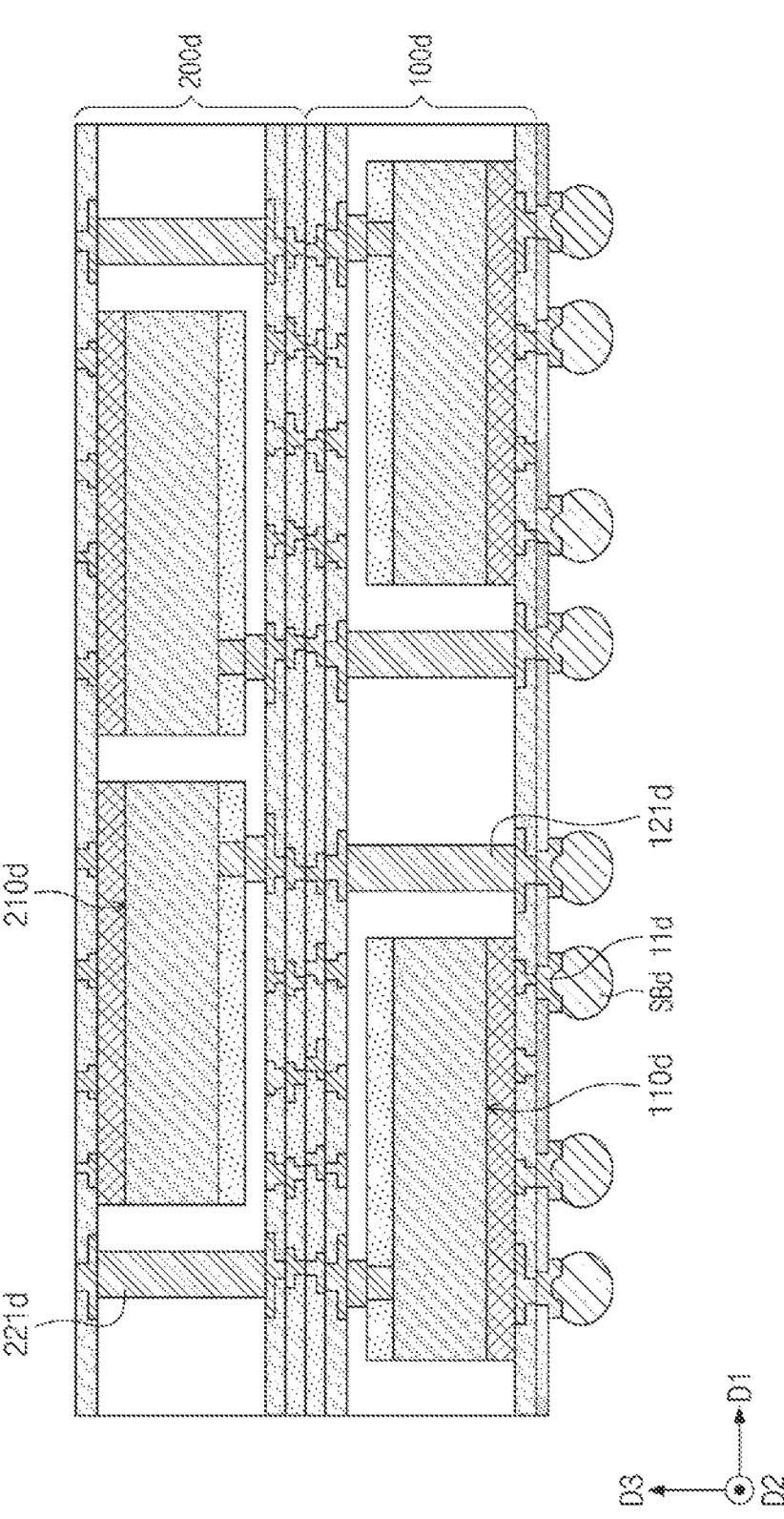
FIG. 8 illustrates a cross-sectional view showing a semiconductor package according to some embodiments.

FIG. 8 illustrates a cross-sectional view showing a semiconductor package according to some embodiments.

Referring to FIG. 8, a semiconductor package may include a solder ball SBd, an under-bump metal (UBM) 11d, a first semiconductor structure 100d on the under-bump metal 11d, and a second semiconductor structure 200d on the first semiconductor structure 100d.

A first connection post 121d may overlap in a third direction D3 with a second semiconductor chip 210d. A plurality of first connection posts 121d may be positioned between adjacent ones of first semiconductor chips 110d. A plurality of first connection posts 121d may be positioned adjacent to each other. A plurality of second semiconductor chips 210d may be positioned between adjacent ones of second connection posts 221d. A plurality of second semiconductor chips 210d may be positioned adjacent to each other.

Figure 9:
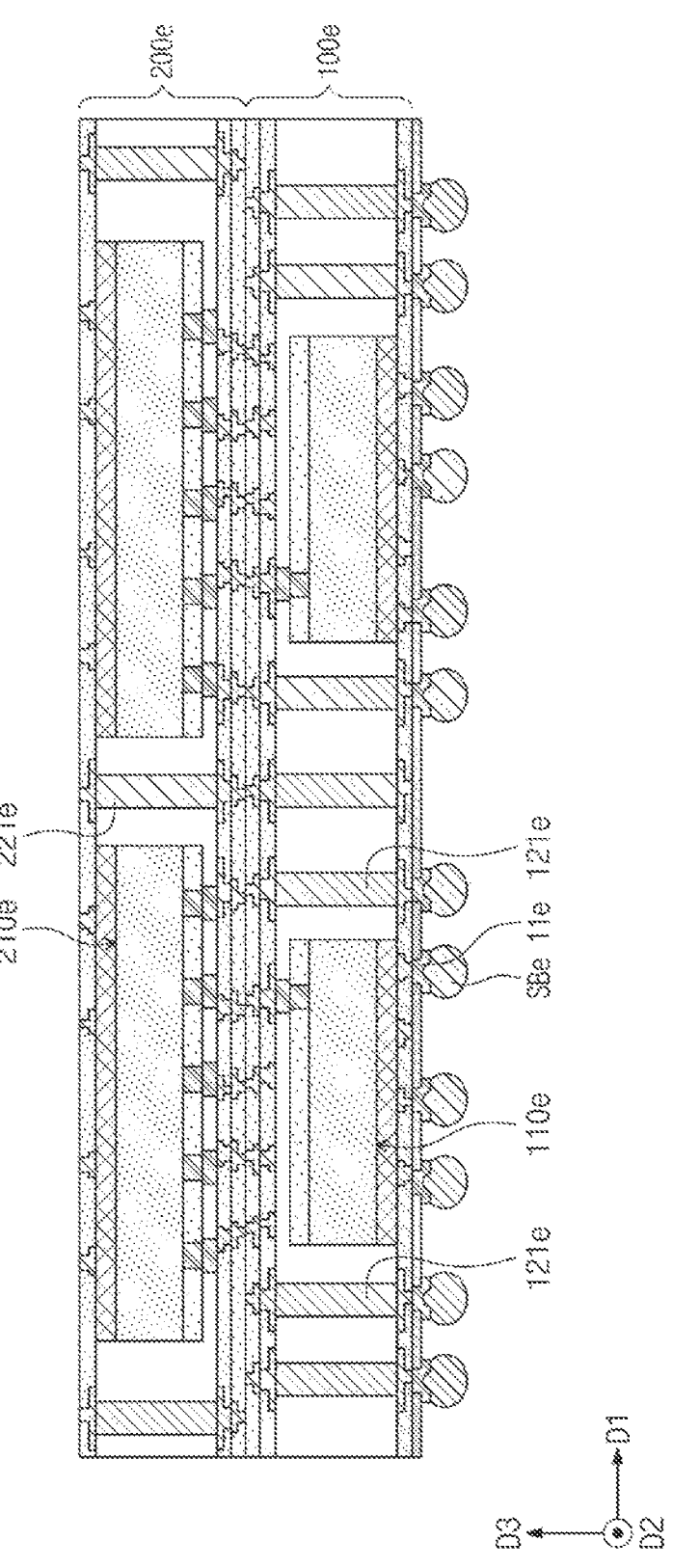
FIG. 9 illustrates a cross-sectional view showing a semiconductor package according to some embodiments.

FIG. 9 illustrates a cross-sectional view showing a semiconductor package according to some embodiments.

Referring to FIG. 9, a semiconductor package may include a solder ball SBe, an under-bump metal (UBM) 11e, a first semiconductor structure 100e, and a second semiconductor structure 200e on the first semiconductor structure 100e.

A first semiconductor chip 110e may be positioned between a plurality of first connection posts 121e. A plurality of first connection posts 121e may be positioned between adjacent ones of the first semiconductor chips 110e. One of the plurality of first connection posts 121e may overlap in a third direction D3 with a second connection post 221e. Each of others of the plurality of first connection posts 121e between the first semiconductor chips 110e may overlap in the third direction D3 with a second semiconductor chip 210e.

The second connection post 221e may be positioned between adjacent ones of the second semiconductor chips 210e. One of the second connection posts 221e may overlap in the third direction D3 with the first connection post 121e. Each of others of the second connection posts 221e may not overlap but may electrically connect to the first connection post 121e or the first semiconductor chip 110e.

In an embodiment, the first semiconductor chips 110e may be memory chips, and the second semiconductor chips 210e may be logic chips.

Figure 10:
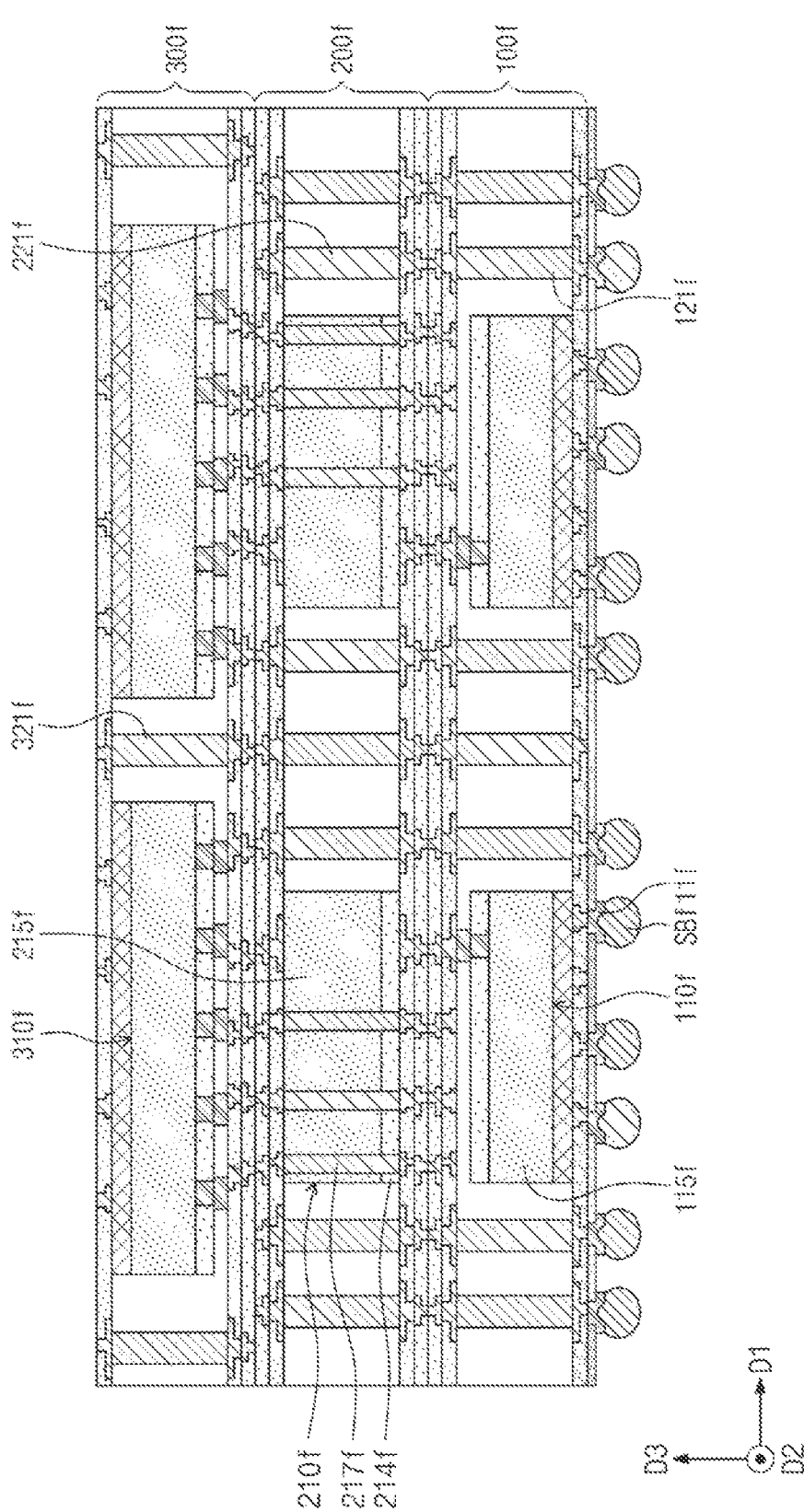
FIG. 10 illustrates a cross-sectional view showing a semiconductor package according to some embodiments.

FIG. 10 illustrates a cross-sectional view showing a semiconductor package according to some embodiments.

Referring to FIG. 10, a semiconductor package may include a solder ball SBf, an under-bump metal (UBM) 11f, a first semiconductor structure 100f, a second semiconductor structure 200f on the first semiconductor structure 100f, and a third semiconductor structure 300f on the second semiconductor structure 200f.

Second semiconductor chips 210f may include one or more through vias 217f.

The second semiconductor chips 210f may include a passivation layer 214f and an active layer 215f. In some embodiments, the active layer 215f may be on the passivation layer 214f. The through via 217f may penetrate the passivation layer 214f and the active layer 215f. The second semiconductor chip 210f may separately include no die attach film. The active layer 215f of the second semiconductor chip 210f may have an active surface that faces the first semiconductor structure 100f.

A first semiconductor chip 110f may be positioned between a plurality of first connection posts 121f. A plurality of first connection posts 121f may be positioned between adjacent ones of the first semiconductor chips 110f. The first connection posts 121f may overlap in a third direction D3 with corresponding second connection posts 221f. An active layer 115f of the first semiconductor chip 110f may have an active surface that faces the second semiconductor structure 200f.

Second connection posts 221f may be positioned between adjacent ones of the second semiconductor chips 210f. One of the second connection posts 221f between the adjacent ones of the second semiconductor chips 210f may overlap in the third direction D3 with a third connection post 321f. Another of the second connection posts 221f between the adjacent ones of the second semiconductor chips 210f may overlap a third semiconductor chip 310f.

Each of others of the second connection posts 221f may not overlap, but may electrically connect to the third connection post 321f or the third semiconductor chip 310f.

Figure 11:
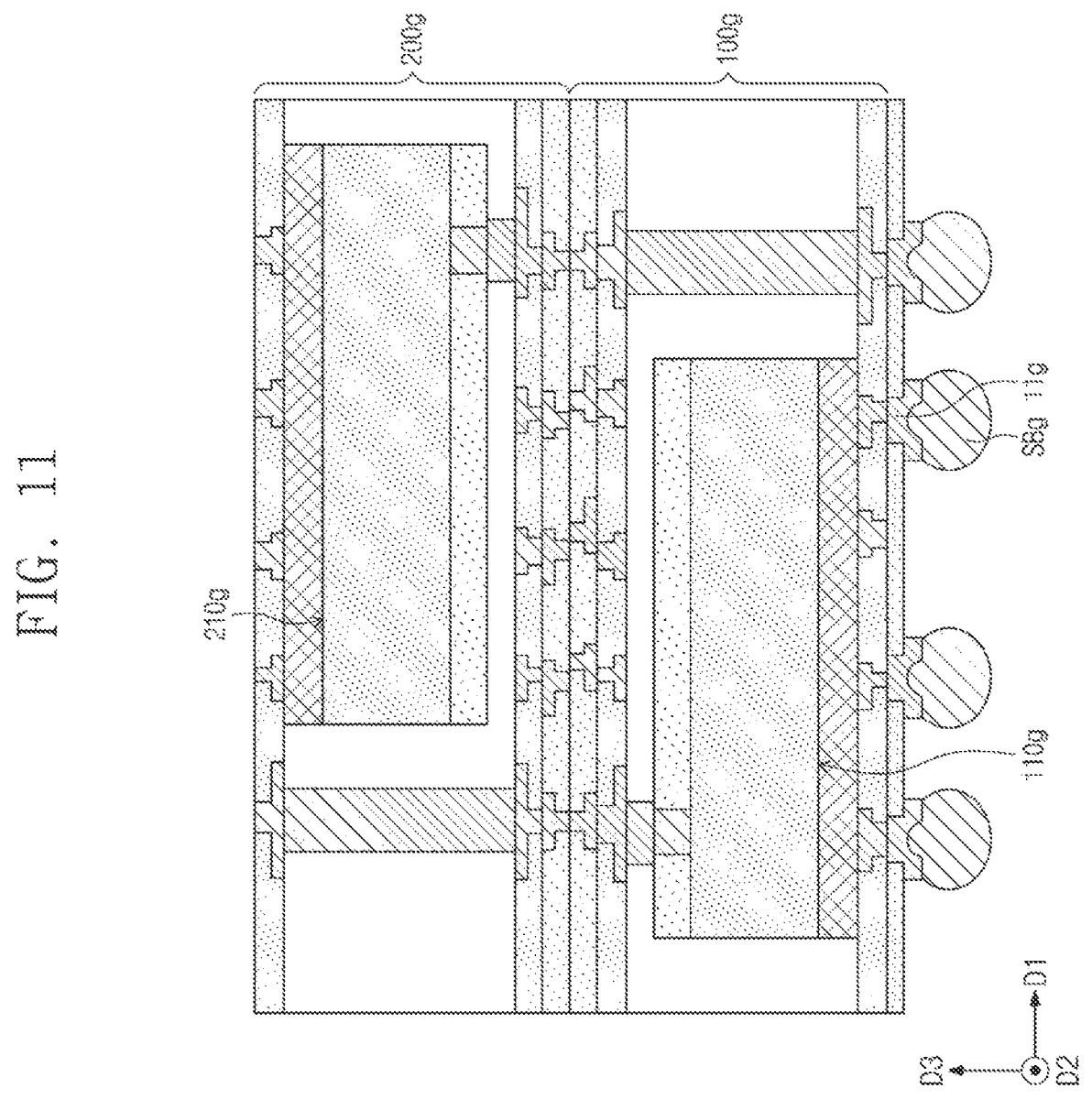

FIG. 11 illustrates a cross-sectional view showing a semiconductor package according to some embodiments.

Referring to FIG. 11, a semiconductor package may include a solder ball SBg, an under-bump metal (UBM) 11g, a first semiconductor structure 100g, and a second semiconductor structure 200g on the first semiconductor structure 100g. The first semiconductor structure 100g may include one semiconductor chip 110g. The second semiconductor structure 200g may include one semiconductor chip 210g.

Figure 12:
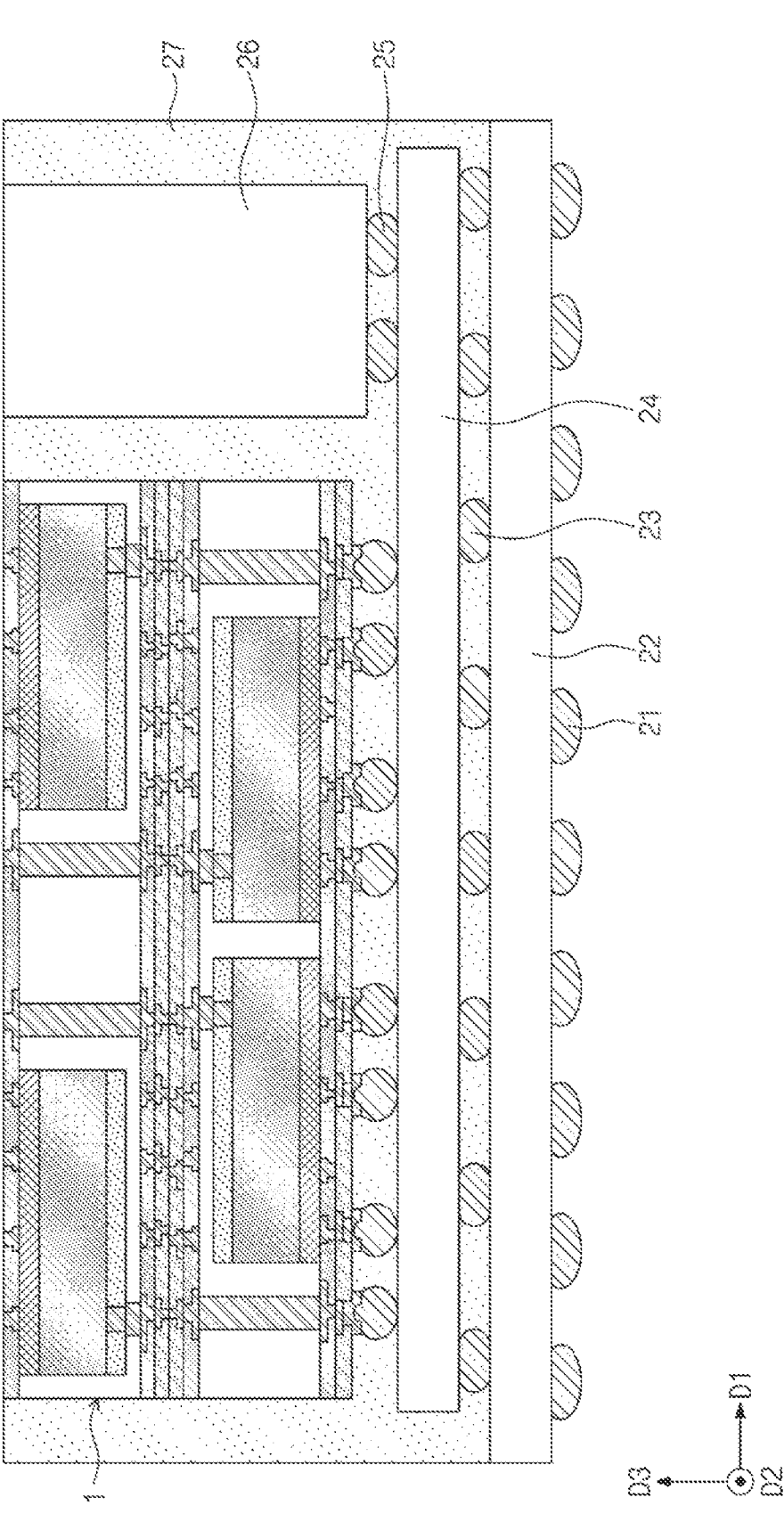
FIG. 12 illustrates a cross-sectional view showing a semiconductor package according to some embodiments.

FIG. 12 illustrates a cross-sectional view showing a semiconductor package according to some embodiments.

Referring to FIG. 12, a semiconductor package may include a package substrate 22. The package substrate 22 may be provided with first terminals 21 electrically connected thereto. The semiconductor package may be mounted through the first terminals 21 on an external apparatus (e.g., main board).

An interposer 24 may be provided on the package substrate 22. Second terminals 23 may be provided to electrically connect the package substrate 22 and the interposer 24 to each other. The second terminals 23 may be provided between the package substrate 22 and the interposer 24.

A processor chip 26 may be provided on the interposer 24. For example, the processor chip 26 may be a graphic processing unit (GPU) or a central processing unit (CPU).

Third terminals 25 may be provided to electrically connect the processor chip 26 and the interposer 24 to each other. The third terminals 25 may be provided between the processor chip 26 and the interposer 24.

A semiconductor package structure 1 may be provided on the interposer 24. The semiconductor package structure 1 may be configured identical or similar to the semiconductor package discussed with reference to FIGS. 1A to 1C. The semiconductor package structure 1 may be spaced apart in a first direction D1 from the processor chip 26. Solder balls may be provided to electrically connect the semiconductor package structure 1 and the interposer 24 to each other.

The package substrate 22 may be provided thereon with a molding layer 27 that surrounds the interposer 24, the processor chip 26, and the semiconductor package structure 1.

A semiconductor package according to some embodiments may have a high stacking density and an optimum electrical connection length through an electrical connection between upper and lower portions thereof, which may result in an improvement in high-speed properties.

Although various embodiments have been described in connection with the some embodiments illustrated in the accompanying drawings, it will be understood by one of ordinary skill in the art that variations in form and detail may be made therein without departing from the spirit of the present disclosure. The above embodiments should thus be considered illustrative and not restrictive.

What is claimed is:

1. A semiconductor package comprising:
a first lower redistribution layer;
a first upper redistribution layer over the first lower redistribution layer;
a first semiconductor chip between the first lower redistribution layer and the first upper redistribution layer;
a first connection post spaced apart from the first semiconductor chip and connecting the first lower redistribution layer to the first upper redistribution layer;
a first interposition layer on the first upper redistribution layer;
a second interposition layer on the first interposition layer;
a second lower redistribution layer on the second interposition layer;
a second upper redistribution layer over the second lower redistribution layer;
a second semiconductor chip between the second lower redistribution layer and the second upper redistribution layer; and
a second connection post spaced apart from the second semiconductor chip and connecting the second lower redistribution layer to the second upper redistribution layer,
wherein:
the first connection post vertically overlaps the second semiconductor chip, and
the second connection post vertically overlaps the first semiconductor chip.

2. The semiconductor package of claim 1, further comprising:
a first die attach film (DAF) in contact with a bottom surface of the first semiconductor chip and a top surface of the first lower redistribution layer; and
a second die attach film (DAF) in contact with a top surface of the second semiconductor chip and a bottom surface of the second upper redistribution layer.

3. The semiconductor package of claim 1, wherein:

the first semiconductor chip includes a plurality of first semiconductor chips, the semiconductor package further includes a plurality of additional first connection posts that are spaced apart from the plurality of first semiconductor chips and that connect the first lower redistribution layer to the first upper redistribution layer, the second semiconductor chip includes a plurality of second semiconductor chips, and the semiconductor package further includes a plurality of additional second connection posts that are spaced apart from the plurality of second semiconductor chips and that connect the second lower redistribution layer to the second upper redistribution layer.

4. The semiconductor package of claim 1, further comprising a solder ball connected to the first lower redistribution layer.

5. The semiconductor package of claim 1, further comprising a first chip post that connects the first semiconductor chip to the first upper redistribution layer.

6. The semiconductor package of claim 5, further comprising a second chip post that connects the second semiconductor chip to the second lower redistribution layer.

7. The semiconductor package of claim 5, wherein:

the first chip post includes copper, each of the first interposition layer and the second interposition layer includes a conductive structure and an interposition dielectric layer that surrounds the conductive structure, the conductive structure includes copper, and the interposition dielectric layer includes an inorganic dielectric material.

8. The semiconductor package of claim 1, wherein each of the first lower redistribution layer, the first upper redistribution layer, the second lower redistribution layer, and the second upper redistribution layer includes a redistribution pattern and a redistribution dielectric layer that surrounds the redistribution pattern, wherein the redistribution dielectric layer includes a photosensitive dielectric material.

9. A semiconductor package comprising:

a first lower redistribution layer;

a first upper redistribution layer on the first lower redistribution layer;

a first semiconductor chip between the first lower redistribution layer and the first upper redistribution layer;

a first interposition layer on the first upper redistribution layer;

a second interposition layer on the first interposition layer;

a second lower redistribution layer on the second interposition layer;

a second upper redistribution layer on the second lower redistribution layer; and a second semiconductor chip between the second lower redistribution layer and the second upper redistribution layer, a first connection post that connects the first lower redistribution layer to the first upper redistribution layer; and a second connection post that connects the second lower redistribution layer to the second upper redistribution layer, wherein each of the first lower redistribution layer, the first upper redistribution layer, the second lower redistribution layer, and the second upper redistribution layer includes a redistribution pattern and a redistribution dielectric layer that surrounds the redistribution pattern, wherein the redistribution dielectric layer includes a photosensitive dielectric material, wherein the first connection post vertically overlaps the second semiconductor chip, and wherein the second connection post vertically overlaps the first semiconductor chip.

10. The semiconductor package of claim 9, further comprising a first chip post that connects the first semiconductor chip to the first upper redistribution layer, wherein the first chip post is between the first semiconductor chip and the first upper redistribution layer.

11. The semiconductor package of claim 10, wherein the first chip post includes copper.

12. The semiconductor package of claim 10, further comprising a second chip post that connects the second semiconductor chip to the second lower redistribution layer, wherein the second chip post is between the second semiconductor chip and the second lower redistribution layer.

13. The semiconductor package of claim 9, further comprising:

a first die attach film in contact with a bottom surface of the first semiconductor chip and a top surface of the first lower redistribution layer; and a second die attach film in contact with a top surface of the second semiconductor chip and a bottom surface of the second upper redistribution layer.

14. The semiconductor package of claim 9, wherein each of the first interposition layer and the second interposition layer includes a conductive structure and an interposition dielectric layer that surrounds the conductive structure, wherein the conductive structure includes copper, and wherein the interposition dielectric layer includes an inorganic dielectric material.

15. A semiconductor package comprising:

a solder ball;

a first lower redistribution layer on the solder ball;

a first die attach film on the first lower redistribution layer;

a first semiconductor chip on the first die attach film;

a first molding layer on the first semiconductor chip;

a first upper redistribution layer on the first molding layer;

a first connection post that connects the first lower redistribution layer to the first upper redistribution layer;

a first chip post that connects the first semiconductor chip to the first upper redistribution layer;

a first interposition layer on the first upper redistribution layer;

a second interposition layer on the first interposition layer;

a second lower redistribution layer on the second interposition layer;

a second molding layer on the second lower redistribution layer;

a second semiconductor chip on the second molding layer;

a second die attach film on the second semiconductor chip;

a second upper redistribution layer on the second die attach film;

a second connection post that connects the second lower redistribution layer to the second upper redistribution layer; and a second chip post that connects the second semiconductor chip to the second lower redistribution layer, wherein the first connection post vertically overlaps the second semiconductor chip, and wherein the second connection post vertically overlaps the first semiconductor chip.

* * * * *